US012727442B2

(12) United States Patent
Tahara et al.

(10) Patent No.: US 12,727,442 B2
(45) Date of Patent: Sep. 1, 2026

(54) SUBSTRATE PROCESSING APPARATUS AND SUBSTRATE PROCESSING METHOD

(71) Applicant: SCREEN Holdings Co., Ltd., Kyoto (JP)

(72) Inventors: Kana Tahara, Kyoto (JP); Masaki Inaba, Kyoto (JP); Ryo Muramoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 211 days.

(21) Appl. No.: 18/689,830

(22) PCT Filed: Jul. 7, 2022

(86) PCT No.: PCT/JP2022/026946
§ 371 (c)(1),
(2) Date: Mar. 6, 2024

(87) PCT Pub. No.: WO2023/037746
PCT Pub. Date: Mar. 16, 2023

(65) Prior Publication Data

US 2024/0258107 A1 Aug. 1, 2024

(30) Foreign Application Priority Data

Sep. 7, 2021 (JP) ................................ 2021-145737

(51) Int. Cl.
*G03F 7/20* (2006.01)
*G03F 7/004* (2006.01)
(Continued)

(52) U.S. Cl.
CPC ........ *H10P 76/2041* (2026.01); *G03F 7/0045* (2013.01); *H10P 50/642* (2026.01); *H10P 72/7618* (2026.01)

(58) Field of Classification Search
CPC ........... H01L 21/0274; H01L 21/30604; H01L 21/68764; H01L 21/31144;
(Continued)

(56) References Cited

U.S. PATENT DOCUMENTS 5,811,211 A * 9/1998 Tanaka .................. G03F 7/2022 430/311
2004/0126713 A1 7/2004 Shiraishi et al. ............. 430/322
(Continued)

FOREIGN PATENT DOCUMENTS

CN 111128694 A 5/2020
JP 2003-197570 A 7/2003
(Continued)

OTHER PUBLICATIONS

International Search Report mailed Oct. 4, 2022 in corresponding PCT International Application No. PCT/JP2022/026946.
(Continued)

*Primary Examiner* — Mesfin T Asfaw
(74) *Attorney, Agent, or Firm* — OSTROLENK FABER LLP

(57) ABSTRACT

A substrate processing apparatus includes a substrate holding member that holds a substrate in a predetermined processing posture, a polymer film forming member that forms a polymer film that contains a photoacid generator that generates an acid by light irradiation and that contains a polymer on a first principal surface of the substrate held by the substrate holding member, a light emission member that emits light and that irradiates light onto a peripheral edge portion of the first principal surface of the substrate held by the substrate holding member, and a reflection suppression member including a first portion that is placeable at an adjoining position that adjoins an irradiation region, onto which light from the light emission member is irradiated, of
(Continued)

the peripheral edge portion of the first principal surface of the substrate held by the substrate holding member from a center portion side of the first principal surface of the substrate.

16 Claims, 23 Drawing Sheets

(51) Int. Cl.
*H10P 50/64* (2026.01)
*H10P 72/76* (2026.01)
*H10P 76/20* (2026.01)

(58) Field of Classification Search
CPC ......... H01L 21/32139; H01L 21/67115; H01L 21/6708; H01L 21/31111; H01L 21/32134; G03F 7/0045; G03F 7/11; C23F 1/02
See application file for complete search history.

(56) References Cited

U.S. PATENT DOCUMENTS

2007/0099396 A1 5/2007 Hirai et al.
2008/0088809 A1* 4/2008 Kosugi .................. G03B 27/52 430/30
2008/0299486 A1 12/2008 Mahoney et al.
2015/0024587 A1 1/2015 Kim et al.
2015/0152328 A1 6/2015 Nakanowatari et al.
2015/0364334 A1 12/2015 Kang et al.
2021/0208504 A1 7/2021 Yamauchi et al.

FOREIGN PATENT DOCUMENTS

JP 2010-529655 A 8/2010
JP 2011-238798 A 11/2011
JP 2015-526880 A 9/2015
JP 2021-039959 A 3/2021
KR 10-2004-0055680 A 6/2004
KR 10-2013-0089176 A 8/2013
TW 200721279 A 10/1995
TW 202004362 A 1/2020

OTHER PUBLICATIONS

Written Opinion mailed Sep. 22, 2022 in corresponding PCT International Application No. PCT/JP2022/026946.
International Preliminary Report on Patentability (Chapter 1) with a Notification from the International Bureau (Form PCT/IB/326) mailed Mar. 21, 2024 in corresponding International Application No. PCT/JP2022/026946.
English translation of the International Preliminary Report on Patentability (Chapter 1) with a Notification from the International Bureau (Form PCT/IB/338) mailed Mar. 21, 2024 in corresponding International Application No. PCT/JP2022/026946.

* cited by examiner

Polymer-containing liquid
Rinsing liquid
Removing liquid
1
2
4
4a
4b
4c
5
7
9
10
11
12
13
18
18a
19
20
21
21a
22
23
24
25
26
27
28
29
30
31
32
33
40
41
42
50
51
52
60
61
62
70
71
L
W
W1
W2
T
A1
CP
ⅢA

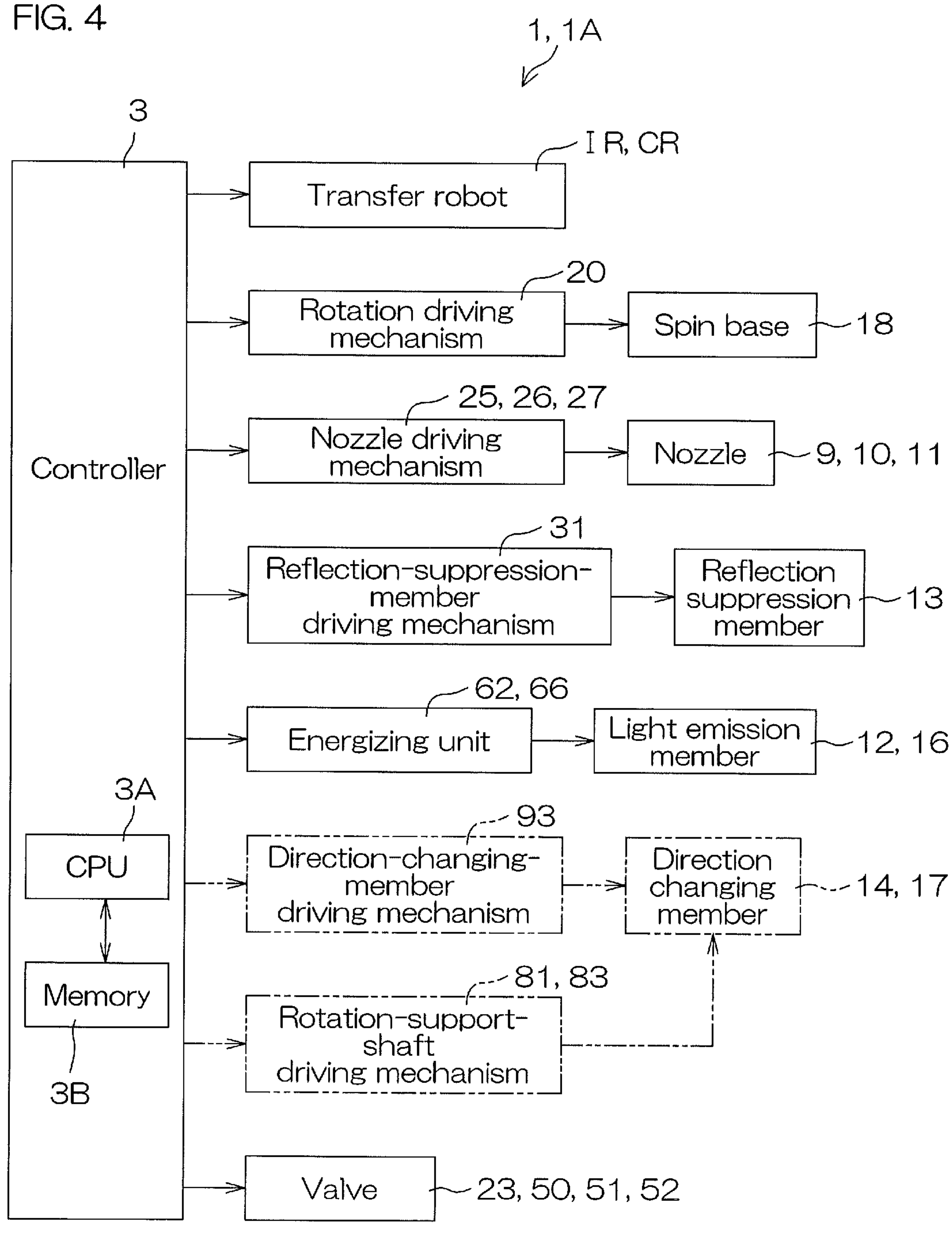
FIG. 4
1, 1A
3
Controller
IR, CR
Transfer robot
20
Rotation driving mechanism
Spin base
18
25, 26, 27
Nozzle driving mechanism
Nozzle
9, 10, 11
31
Reflection-suppression-member driving mechanism
Reflection suppression member
13
62, 66
Energizing unit
Light emission member
12, 16
3A
CPU
93
Direction-changing-member driving mechanism
Direction changing member
14, 17
Memory
3B
81, 83
Rotation-support-shaft driving mechanism
Valve
23, 50, 51, 52

Start
S1
Substrate carry-in step
S2
Polymer film forming step
S3
Light irradiation step
S4
Polymer film removing step
S5
Rinsing step
S6
Spin drying step
S7
Substrate carry-out step
End Polymer-containing liquid
9
W2
W1
CP
T
RD
W
A1

W2
W1
CP
100
T
RD
W
A1

60
12
61
4a
4
13
L
W2
W1
CP
100
T
RD
W
A1

Start
S1
Substrate carry-in step
S2
Polymer film application step
S3
Light irradiation step
S4
Polymer film removing step
S5
Rinsing step
S6
Spin drying step
S7
Substrate carry-out step
End 60
12
61
4a
4
70a
70b
L
70
13
71
W1
100
EA
102
RA1 (RA)
101
T
W
W2

70
13
W1
104
102
101
T
W
W2

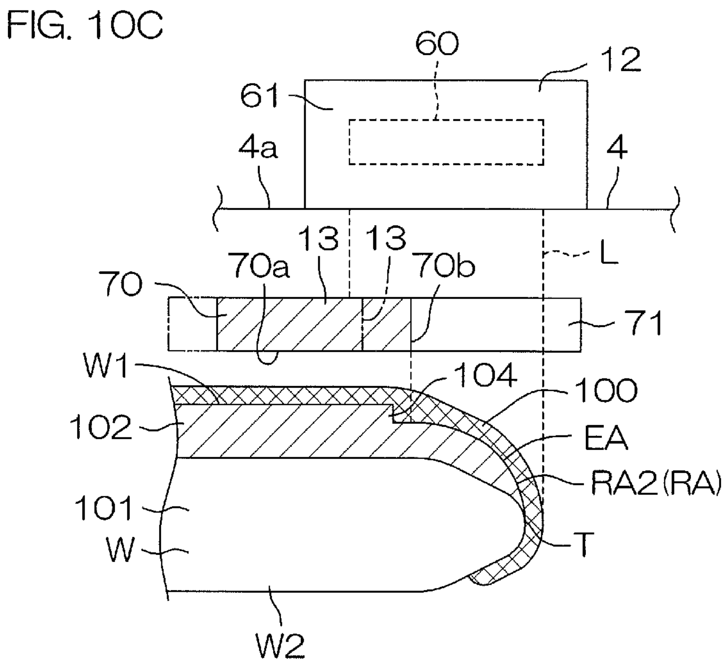
FIG. 10C
FIG. 10D
W1
104
102
101
W
T
W2
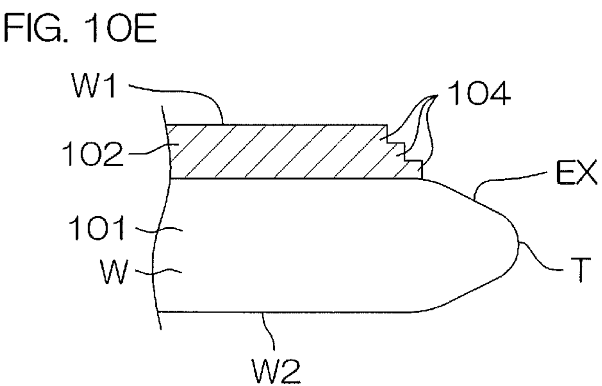
FIG. 10E 1
2
60
12
62
61
4a
4
31
32
33
L
XIV
XIV
70
13
21a
A1, A2
W1
W
18a
CP
T
18
W2
21
5
19
23
20
24
22
4c 1A
2
4
4a
4b
4c
Removing liquid
Rinsing liquid
Polymer-containing liquid
L
W
W1
W2
T
CP
A1
5
7
9
10
11
12
13
14
18
18a
19
20
21
21a
22
23
24
25
26
27
28
29
30
31
32
33
40
41
42
50
51
52
60
61
62
70
71
80
81

1A
2
T
W1
W2
W
18
18a
21a
A1
CP
81
13
70
80
14
L
33
32
31
61
12
60
62
4
4b
71
4c
5
19
20
21
22
23
24

1A
2
62
12
61
60
15
65
64
66
4
4b
L
33
32
31
14
80
81
82
83
17
71
70
13
16
5
4c
19
20
21
A1
CP
21a
18a
18
22
23
24
W
W1
W2
T 1A
2
A1
CP
21a
18a
18
W
W1
W2
T
XXI
70
13
71
14
5
19
20
21
22
23
24
4c
31
33
32
93
94
95
L
4
61
12
60
62
4b

SUBSTRATE PROCESSING APPARATUS AND SUBSTRATE PROCESSING METHOD

CROSS-REFERENCE TO RELATED APPLICATIONS

The present application is a 35 U.S.C. §§ 371 national stage application of International Application No. PCT/JP2022/026946 filed Jul. 7, 2022, which claims priority to Japanese Patent Application No. 2021-145737, filed Sep. 7, 2021, the contents of which are incorporated herein by reference.

RELATED APPLICATION

This application claims the priority benefit of Japanese Patent Application No. 2021-145737 filed on Sep. 7, 2021, the entire disclosure of which is incorporated herein by reference.

TECHNICAL FIELD

The present invention relates to a substrate processing apparatus that processes substrates and relates to a substrate processing method for processing substrates. Examples of substrates to be processed include semiconductor wafers, substrates for FPDs (Flat Panel Displays) of liquid crystal display devices and organic of EL (Electroluminescence) display devices or similar display devices, substrates for optical disks, substrates for magnetic disks, substrates for magneto-optical disks, substrates for photomasks, ceramic substrates, substrates for solar batteries, etc.

BACKGROUND ART

Patent Literature 1 mentioned below discloses a technique in which a multilayer formed on an upper surface of a substrate is etched by landing an etching liquid at a position fixed at a distance of a predetermined width inwardly from a peripheral edge of the substrate and by blowing off the etching liquid outwardly from the substrate by use of a gas flow of inert gas.

CITATION LIST

Patent Literature

Patent Literature 1: Japanese Patent Application Publication No. 2021-39959

SUMMARY OF INVENTION

Technical Problem

An etching liquid is used to etch the substrate in the technique disclosed by Patent Literature 1. The etching liquid that has landed on the upper surface of the substrate spreads on the upper surface of the substrate. Therefore, it is difficult to accurately control the width of a region that is to be etched in a peripheral edge portion of the upper surface of the substrate, i.e., it is difficult to accurately control an etching width.

Therefore, an object of the present invention is to provide a substrate processing apparatus and a substrate processing method that are capable of accurately controlling an etching width.

Solution to Problem

A preferred embodiment of the present invention provides a substrate processing apparatus that processes a substrate having a first principal surface and a second principal surface on a side opposite to the first principal surface. The substrate processing apparatus includes a substrate holding member that holds the substrate in a predetermined processing posture, a polymer film forming member that forms a polymer film that contains a photoacid generator that generates an acid by light irradiation and that contains a polymer on the first principal surface of the substrate held by the substrate holding member, a light emission member that emits light and that irradiates light onto a peripheral edge portion of the first principal surface of the substrate held by the substrate holding member, and a reflection suppression member including a first portion that is placeable at an adjoining position that adjoins an irradiation region, onto which light from the light emission member is irradiated, of the peripheral edge portion of the first principal surface of the substrate held by the substrate holding member from a center portion side of the first principal surface of the substrate, the reflection suppression member suppressing optical reflection from the reflection suppression member.

With this apparatus, a polymer film that contains a photoacid generator and a polymer is formed on the first principal surface of the substrate by means of the polymer film forming member. Light emitted from the light emission member is irradiated onto the peripheral edge portion of the first principal surface of the substrate in a state in which the polymer film is formed on the first principal surface of the substrate, and, as a result, it is possible to generate an acid in the polymer film. The peripheral edge portion of the first principal surface of the substrate is etched by the acid generated in the polymer film. In other words, the acid generated in the polymer film functions as an etching agent. As thus described, the region (irradiation region), onto which light has been irradiated, of the peripheral edge portion of the first principal surface of the substrate is etched.

A polymer is contained in the polymer film, and therefore the fluidity of the polymer film is reduced. Therefore, an acid generated in the polymer film easily remains at the position of generation. Therefore, it is possible to accurately control the width of a region (etching region), in which etching is performed, of the peripheral edge portion of the first principal surface of the substrate, i.e., it is possible to accurately control an etching width. The etching width corresponds to a distance between the peripheral edge (front end) of the substrate and an end portion of the etching region on the center portion side of the first principal surface.

With this apparatus, the reflection suppression member includes the first portion that is placeable at an adjoining position at which the first portion adjoins the irradiation region from the center portion side of the first principal surface of the substrate. Therefore, the reflection of light from the reflection suppression member is suppressed even if the light is reflected from the irradiation region and is irradiated onto the first portion. Therefore, it is possible to suppress the light reflected from the irradiation region from being irradiated onto a position closer to the center portion of the first principal surface than the reflection suppression member. Therefore, it is possible to more precisely control the etching width by means of the reflection suppression member.

In a preferred embodiment of the present invention, the substrate processing apparatus further includes a substrate rotation mechanism that rotates the substrate around a rotational axis passing through a center portion of the first principal surface of the substrate held by the substrate holding member. The light emission member emits light toward a predetermined range in a rotation direction around the rotational axis in the peripheral edge portion of the first principal surface of the substrate held by the substrate holding member.

With this apparatus, light is emitted from the light emission member toward a predetermined range in the rotation direction in the peripheral edge portion of the first principal surface of the substrate. The light is irradiated onto the peripheral edge portion of the first principal surface of the substrate while rotating the substrate around the rotational axis, and, as a result, it is possible to etch the peripheral edge portion of the first principal surface of the substrate in the entire periphery. Therefore, the light is irradiated onto the predetermined range on the peripheral edge portion of the first principal surface of the substrate, and therefore it is possible to make irregular irradiation smaller than in a case in which the light is simultaneously irradiated onto the whole area of the peripheral edge portion of the first principal surface of the substrate. Therefore, it is possible to accurately control the etching width in the entire periphery of the substrate.

In a preferred embodiment of the present invention, the reflection suppression member further includes a second portion that is connected to the first portion and that adjoins the irradiation region from at least one side of the rotation direction when the first portion is placed at the adjoining position.

With this apparatus, the second portion of the reflection suppression member adjoins the irradiation region from at least one side of the rotation direction when the first portion is placed at the adjoining position. Therefore, the reflection of light from the reflection suppression member is suppressed even if the light is reflected from the irradiation region and is irradiated onto the second portion. Therefore, it is possible to suppress the light reflected from the irradiation region from being irradiated onto the side opposite to the irradiation region across the reflection suppression member in the rotation direction. Therefore, it is possible to more precisely control the etching width by the reflection suppression member.

In a preferred embodiment of the present invention, the first portion assumes an annular shape or a circular shape having a center axis, and the center axis is placed on the rotational axis when the first portion is placed at the adjoining position. Therefore, if the first portion is placed at the adjoining position, the first portion is enabled to always suppress the light from being irradiated onto a position closer to the center portion of the first principal surface of the substrate than the first portion in the whole area in the rotation direction. Therefore, it is possible to highly reliably suppress the light reflected from the irradiation region from being irradiated onto a position closer to the center portion of the first principal surface of the substrate than the irradiation region in the entire periphery of the first principal surface of the substrate.

In a preferred embodiment of the present invention, the adjoining position is an intercept position at which the first portion intercepts part of light emitted from the light emission member. Therefore, it is possible to control the size of the irradiation region by controlling the position of the first portion of the reflection suppression member. Thereby, it is possible to control the etching width.

In a preferred embodiment of the present invention, the first portion has a facing surface that faces the first principal surface of the substrate in a state parallel to the first principal surface of the substrate held by the substrate holding member when the first portion is placed at the adjoining position and an orthogonal surface that is connected to the facing surface and that is orthogonal to the facing surface. Therefore, it is possible to suppress light emitted from the light emission member from being irradiated onto a position closer to the center portion of the first principal surface than the orthogonal surface in the first principal surface. Therefore, it is possible to define the irradiation region along the orthogonal surface. Therefore, it is possible to accurately control the etching width.

In a preferred embodiment of the present invention, the first portion has a facing surface that faces the first principal surface of the substrate in a state parallel to the first principal surface of the substrate held by the substrate holding member when the first portion is placed at the adjoining position and an inclined surface that is connected to the facing surface so as to make an acute angle with the facing surface inside the first portion and that is inclined with respect to the facing surface.

With this apparatus, it is possible to suppress light emitted from the light emission member from being irradiated onto a position closer to the center portion than the inclined surface in the first principal surface. Additionally, light is emitted from the light emission member along the inclined surface, thus making it possible to obliquely etch the to-be-processed film exposed from the first principal surface of the substrate. Thereby, an outer end in the radial direction of the to-be-processed film of the peripheral edge portion of the first principal surface of the substrate is enabled to assume a tapered shape. As a result, it is possible to suppress the to-be-processed film from being unintendedly peeled off after the substrate processing is completed.

In a preferred embodiment of the present invention, the substrate processing apparatus further includes a chamber that houses the substrate holding member, the chamber having a supporting wall that faces the first principal surface of the substrate held by the substrate holding member and that supports the light emission member.

With this apparatus, it is possible to irradiate light emitted from the light emission member onto the peripheral edge portion of the first principal surface of the substrate without changing the traveling direction of the light. Therefore, it is possible to exclude members used to change the traveling direction of the light.

In a preferred embodiment of the present invention, the substrate processing apparatus further includes a direction changing member that changes a traveling direction of light emitted from the light emission member so that the traveling direction of the light approaches an orthogonal direction with respect to the first principal surface of the substrate held by the substrate holding member.

With this apparatus, it is possible to allow the traveling direction of light to approach a direction orthogonal to the first principal surface of the substrate even if the traveling direction of light emitted from the light emission member is a direction along the first principal surface of the substrate. Therefore, it is possible to improve the degree of freedom of the disposition of the light emission member.

In a preferred embodiment of the present invention, the direction changing member includes a support portion having a recess portion that is capable of housing the peripheral edge portion of the substrate held by the substrate holding member, and a reflecting portion that is provided at an edge portion of the recess portion and that reflects light emitted from the light emission member, the reflecting portion facing both the first principal surface and the second principal surface of the substrate in a state in which the peripheral edge portion of the substrate held by the substrate holding member is housed in the recess portion.

With this apparatus, it is possible to irradiate light onto not only the first principal surface of the substrate but also the second principal surface of the substrate. Therefore, it is possible to etch the peripheral edge portion of the first principal surface, and simultaneously etch the peripheral edge portion of the second principal surface.

Another preferred embodiment of the present invention provides a substrate processing method for processing a substrate having a first principal surface and a second principal surface on a side opposite to the first principal surface. The substrate processing method includes a substrate holding step of holding the substrate in a predetermined processing posture, a polymer film forming step of forming a polymer film that contains a photoacid generator that generates an acid by light irradiation and that contains a polymer on the first principal surface of the substrate, and a light irradiation step of irradiating light onto a region on the first principal surface of the substrate that adjoins a reflection suppression member from a side opposite to a center portion of the first principal surface of the substrate with respect to the reflection suppression member in a state in which the reflection suppression member that suppresses light reflection faces a peripheral edge portion of the first principal surface of the substrate.

According to this method, a polymer film that contains a photoacid generator and a polymer is formed on the first principal surface of the substrate. Light is irradiated onto the peripheral edge portion of the first principal surface of the substrate in a state in which the polymer film is formed on the first principal surface of the substrate, and, as a result, it is possible to generate an acid in the polymer film. The peripheral edge portion of the first principal surface of the substrate is etched by the acid generated in the polymer film. In other words, the acid generated in the polymer film is enabled to function as an etching agent. As thus described, the region (irradiation region), onto which light has been irradiated, of the peripheral edge portion of the first principal surface of the substrate is etched.

A polymer is contained in the polymer film, and therefore the fluidity of the polymer film is reduced. Therefore, an acid generated in the polymer film easily remains at the position of generation. Therefore, it is possible to accurately control the width of a region (etching region), in which etching is performed, of the peripheral edge portion of the first principal surface of the substrate, i.e., it is possible to accurately control an etching width. The etching width corresponds to a distance between the peripheral edge (front end) of the substrate and an end portion of the etching region on the center portion side of the first principal surface of the substrate.

According to this method, light is irradiated onto a region on the first principal surface of the substrate that adjoins the reflection suppression member from a side opposite to the center portion of the first principal surface of the substrate with respect to the reflection suppression member in a state in which the reflection suppression member that suppresses light reflection faces the peripheral edge portion of the first principal surface of the substrate. Therefore, the reflection of light from the reflection suppression member is suppressed even if the light is reflected from the irradiation region and is irradiated onto the first portion. Therefore, it is possible to suppress the light reflected from the irradiation region from being irradiated onto a position closer to the center portion of the first principal surface than the reflection suppression member. Therefore, it is possible to more precisely control the etching width by means of the reflection suppression member.

In another preferred embodiment of the present invention, the polymer film forming step includes a step of forming the polymer film in the peripheral region without forming the polymer film in a more inward region on a center portion side than a peripheral region including the peripheral edge portion in the first principal surface of the substrate.

According to this method, it is possible to accurately control the etching width the peripheral edge portion of the first principal surface of the substrate while reducing the consumption of the polymer film.

In another preferred embodiment of the present invention, the substrate processing method further includes a substrate rotating step of rotating the substrate around a rotational axis passing through a center portion of the substrate. The light irradiation step includes a step of irradiating light onto a predetermined range in a rotation direction around the rotational axis in the peripheral edge portion of the first principal surface of the substrate.

According to this method, light is emitted from the light emission member toward a predetermined range in the rotation direction in the peripheral edge portion of the first principal surface of the substrate. The light is irradiated onto the peripheral edge portion of the upper surface of the substrate while rotating the substrate around the rotational axis, and, as a result, it is possible to etch the peripheral edge portion of the upper surface of the substrate in the entire periphery. Therefore, the light is irradiated onto the predetermined range on the peripheral edge portion of the first principal surface of the substrate, and therefore it is possible to make irregular irradiation smaller than in a case in which the light is simultaneously irradiated onto the whole area of the peripheral edge portion of the first principal surface of the substrate. Therefore, it is possible to accurately control the etching width in the entire periphery of the substrate.

In another preferred embodiment of the present invention, the substrate processing method further includes an irradiation region adjusting step of adjusting a size of an irradiation region onto which light is irradiated in the first principal surface of the substrate by disposing the reflection suppression member at an intercept position at which part of light emitted from the light emission member is intercepted in the light irradiation step.

According to this method, it is possible to control the size of the irradiation region by intercepting part of light emitted from the light emission member by means of the reflection suppression member. Thereby, it is possible to accurately control the etching width.

In another preferred embodiment of the present invention, the polymer film forming step and the light irradiation step are alternately performed a plurality of times. The plurality of light irradiation steps include a first light irradiation step of emitting light toward the peripheral edge portion of the first principal surface of the substrate and a second light irradiation step of being performed after the first light irradiation step and emitting light toward the peripheral edge portion of the first principal surface of the substrate. The irradiation region adjusting step includes a step of moving the reflection suppression member so that a first irradiation region in which light is irradiated onto the first principal surface of the substrate in the first light irradiation step reaches a side closer to the center portion of the first principal surface of the substrate than a second irradiation region in which light is irradiated onto the first principal surface of the substrate in the second light irradiation step.

According to this method, the reflection suppression member is moved so that the first irradiation region is placed closer to the center portion of the first principal surface of the substrate than the second irradiation region. Therefore, light is not irradiated onto part of the region etched by the first light irradiation step in the peripheral edge portion of the first principal surface of the substrate. Therefore, a level difference is formed in the to-be-processed film so that the to-be-processed film becomes thinner toward the peripheral edge (front end) of the substrate. As a result, it is possible to suppress the to-be-processed film from being unintendedly peeled off after the substrate processing is completed.

BRIEF DESCRIPTION OF DRAWINGS

FIG. 4 is a block diagram for describing an electrical configuration of the substrate processing apparatus.

FIG. 10C is a schematic view for describing a change in the peripheral edge portion of the substrate while the substrate processing according to the second modification is being performed.

FIG. 10D is a schematic view for describing a change in the peripheral edge portion of the substrate while the substrate processing according to the second modification is being performed.

FIG. 10E is a schematic view for describing a change in the peripheral edge portion of the substrate while the substrate processing according to the second modification is being performed.

DESCRIPTION OF EMBODIMENTS

Preferred Embodiments of the Present Invention will be hereinafter described with reference to the accompanying drawings.

<Configuration of Substrate Processing Apparatus According to First Preferred Embodiment>

Figure 1:
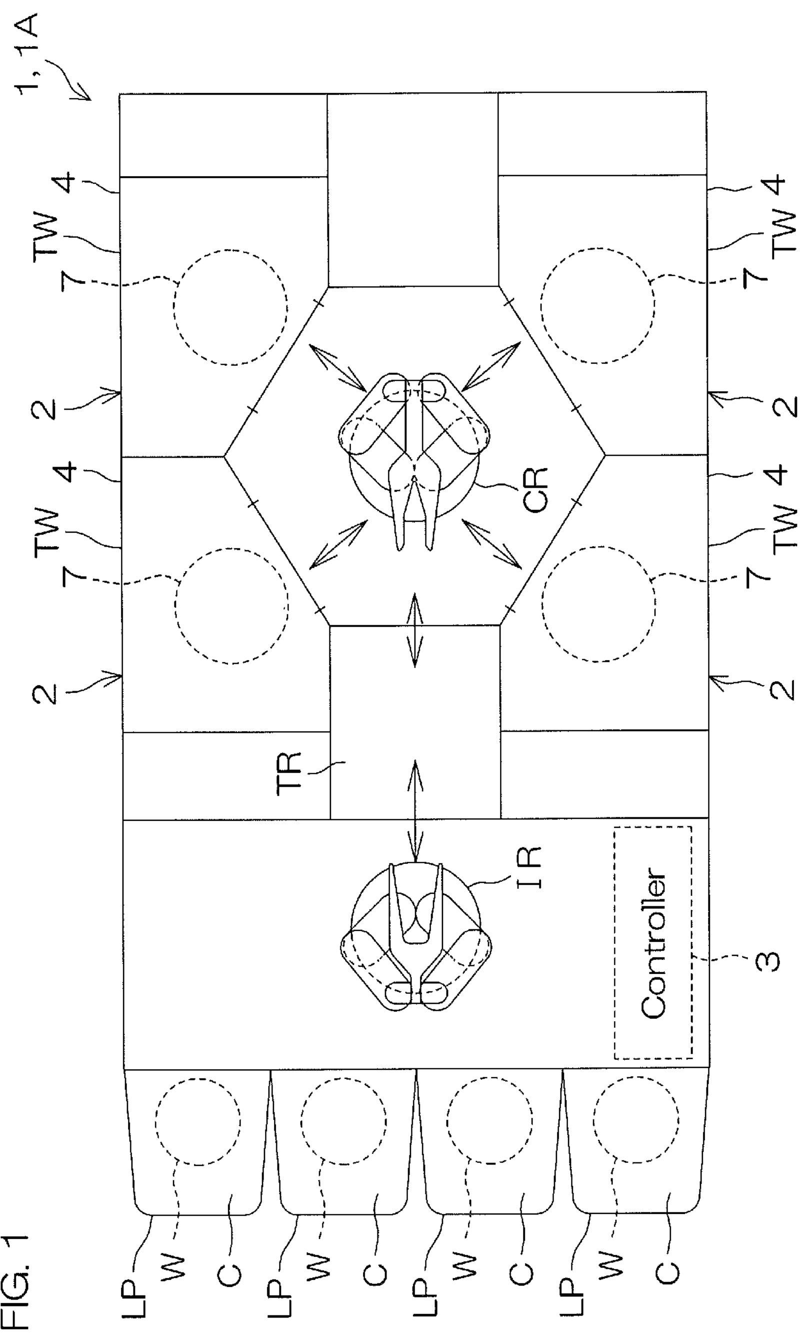
FIG. 1 is a plan view for describing a configuration example of a substrate processing apparatus according to a first preferred embodiment of the present invention.

FIG. 1 is a plan view for describing a configuration example of a substrate processing apparatus 1 according to a first preferred embodiment of the present invention.

The substrate processing apparatus 1 is a single substrate processing type apparatus that processes substrates W one by one. In this preferred embodiment, the substrate W has a disk shape. The substrate W is a substrate of a silicon wafer or the like, and has a pair of principal surfaces. A first principal surface W1 (see FIG. 2 described later) and a second principal surface W2 (see FIG. 2 described later) on the side opposite to the first principal surface W1 are included in the pair of principal surfaces. An example in which an upper surface (upper principal surface) is the first principal surface W1 and in which a lower surface (lower principal surface) is the second principal surface W2 will be hereinafter described except in a case in which a particular description is made.

The substrate processing apparatus 1 includes a plurality of processing units 2 that process substrates W, a load port LP (container holding unit) on which a carrier C (container) that contains a plurality of substrates W that are processed by the processing units 2 is placed, transfer robots (first transfer robot IR and second transfer robot CR) that transfer the substrate W between the load port LP and the processing unit 2, and a controller 3 that controls each member included in the substrate processing apparatus 1.

The first transfer robot IR transfers the substrate W between the carrier C and the second transfer robot CR. The second transfer robot CR transfers the substrate W between the first transfer robot IR and the processing unit 2. Each of the transfer robots is, for example, an articulated-arm robot.

The plurality of processing units 2 are arranged at both sides of a transfer path TR along the transfer path TR along which the substrate W is transferred by the second transfer robot CR, and are arranged so as to be stacked together in an up-down direction. The plurality of processing units 2 have, for example, the same configuration.

The plurality of processing units 2 form four processing towers TW disposed at four positions, respectively, that are horizontally away from each other. Each of the processing towers TW includes a plurality of processing units 2 stacked together in the up-down direction. The four processing towers TW are disposed two by two at both sides of the transfer path TR extending from the load port LP toward the second transfer robot CR.

The processing unit 2 includes a chamber 4 that houses the substrate W when substrate processing is performed and a processing cup 7 disposed in the chamber 4, and applies processing to the substrate W in the processing cup 7. The chamber 4 includes an entrance-exit opening (not shown) through which the substrate W is carried into the chamber 4 and is carried out of the chamber 4 by means of the second transfer robot CR and a shutter unit (not shown) that opens and closes the entrance-exit opening. A polymer-containing liquid, a removing liquid, a rinsing liquid, etc., are mentioned as a processing liquid supplied to the substrate W in the chamber 4, which will be described in detail later.

<Configuration of Processing Unit According to First Preferred Embodiment>

Figure 2:
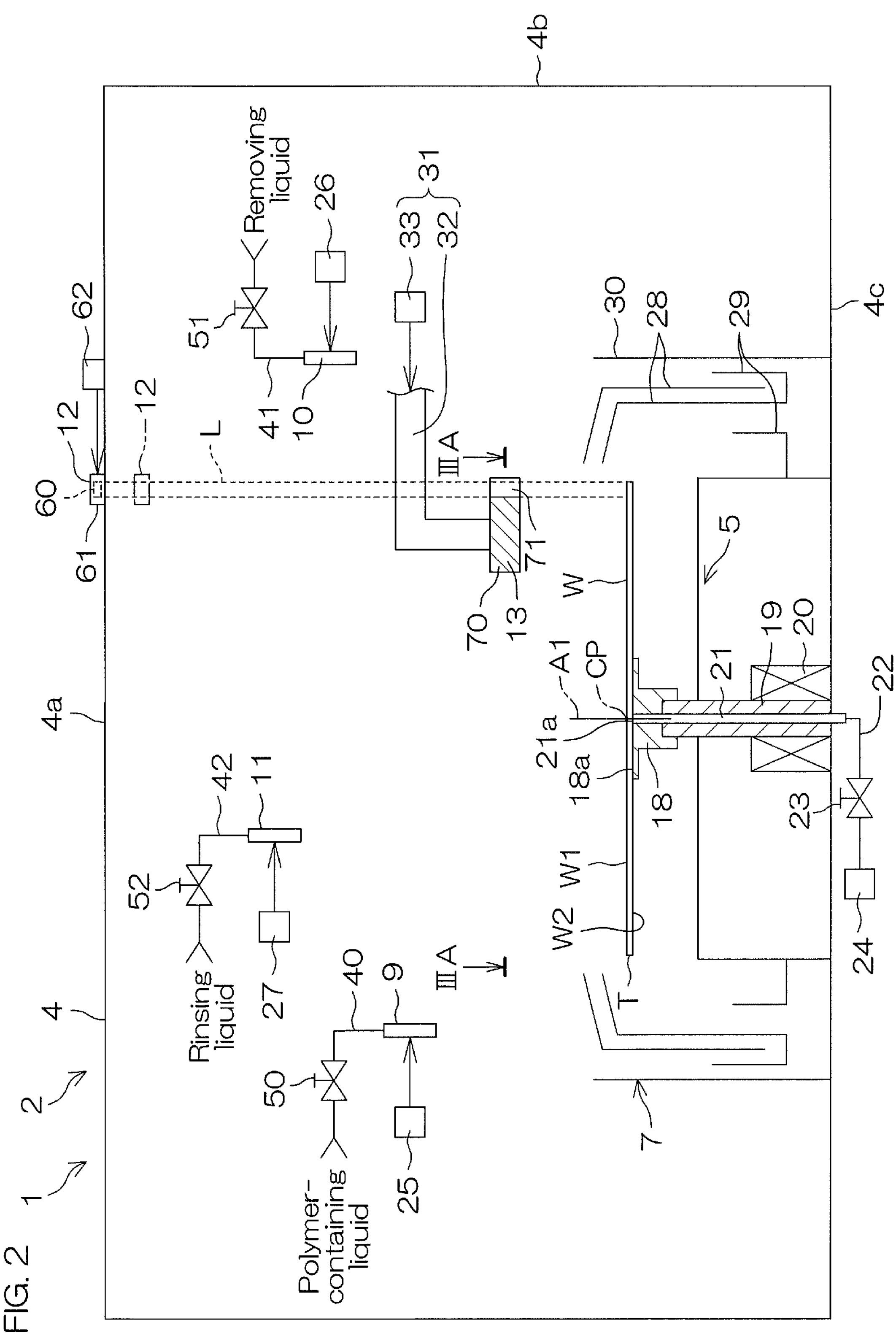
FIG. 2 is a schematic view for describing a configuration of a processing unit included in the substrate processing apparatus.

FIG. 2 is a schematic view for describing a configuration of the processing unit 2.

The processing unit 2 additionally includes a spin chuck 5 that rotates the substrate W around a rotational axis A1 while holding the substrate W in a predetermined processing posture, a plurality of processing liquid nozzles (polymer-containing liquid nozzle 9, removing-liquid nozzle 10, and rinsing-liquid nozzle 11) that discharge a processing liquid toward the upper surface of the substrate W held by the spin chuck 5, a light emission member 12 that emits light L toward the upper surface of the substrate W held by the spin chuck 5, and a reflection suppression member 13 that suppresses the reflection of light L.

The spin chuck 5, the plurality of processing liquid nozzles, and the reflection suppression member 13 are disposed in the chamber 4. The light emission member 12 is disposed outside the chamber 4. The chamber 4 includes a bottom wall 4*c* that supports the spin chuck 5, an upper wall 4*a* that faces the substrate W held by the spin chuck 5, and a sidewall 4*b* that connects the bottom wall 4*c* and the upper wall 4*a* together. An internal space of the chamber 4 is divided by the upper wall 4*a*, the bottom wall 4*c*, and the sidewall 4*b*.

The rotational axis A1 passes through a center portion CP of the upper surface of the substrate W, and orthogonally intersects each of the principal surfaces of the substrate W held in a processing posture. In this preferred embodiment, the processing posture is a horizontal posture in which the principal surface of the substrate W assumes a horizontal plane. The horizontal posture is a posture of the substrate W shown in FIG. 2, and the rotational axis A1 vertically extends when the processing posture is the horizontal posture.

The spin chuck 5 includes a spin base 18 that suctions onto the lower surface of the substrate W and that holds the substrate W in a processing posture, a rotational shaft 19 that extends along the rotational axis A1 and that is united with the spin base 18, and a rotation driving mechanism 20 that rotates the rotational shaft 19 around the rotational axis A1.

The spin base 18 has a suction surface 18*a* that suctions onto the lower surface of the substrate W. The suction surface 18*a* is, for example, an upper surface of the spin base 18, and is a circular surface having a central portion through which the rotational axis A1 passes. The diameter of the suction surface 18*a* is smaller than the diameter of the substrate W. An upper end portion of the rotational shaft 19 is united with the spin base 18.

A suction path 21 is inserted in the spin base 18 and in the rotational shaft 19. The suction path 21 has a suction port 21*a* exposed from the center of the suction surface 18*a* of the spin base 18. The suction path 21 is connected to a suction pipe 22. The suction pipe 22 is connected to a suction device 24 such as a vacuum pump. The suction device 24 may form a part of the substrate processing apparatus 1, or may be a device that differs from the substrate processing apparatus 1 and that is provided in facilities in which the substrate processing apparatus 1 is installed.

The suction pipe 22 is provided with a suction valve 23 that opens and closes the suction pipe 22. The suction valve 23 is opened, and, as a result, the substrate W disposed on the suction surface 18*a* of the spin base 18 is sucked to the suction port 21*a* of the suction path 21. Thereby, the substrate W is suctioned onto the suction surface 18*a* from below, and is held in the processing posture.

The rotational shaft 19 is rotated by the rotation driving mechanism 20, and, as a result, the spin base 18 is rotated. Thereby, the substrate W is rotated around the rotational axis A1 together with the spin base 18. The rotation driving mechanism 20 is an example of a substrate rotation mechanism that rotates the substrate W held by the spin base 18 around the rotational axis A1.

The spin base 18 is an example of a substrate holding member (substrate holder) that holds the substrate W in a horizontal posture (predetermined processing posture). The spin chuck 5 is an example of a rotation holding unit that rotates the substrate W around the rotational axis A1 while holding the substrate W in a horizontal posture (predetermined processing posture). The spin chuck 5 is also referred to as an suction rotating unit that rotates the substrate W suctioning onto the suction surface 18*a*.

The plurality of processing liquid nozzles include a polymer-containing liquid nozzle 9 that discharges a continuous flow of a polymer-containing liquid toward the upper surface of the substrate W held by the spin chuck 5, a removing-liquid nozzle 10 that discharges a continuous flow of a removing liquid toward the upper surface of the substrate W held by the spin chuck 5, and a rinsing-liquid nozzle 11 that discharges a continuous flow of a rinsing liquid toward the upper surface of the substrate W held by the spin chuck 5.

The polymer-containing liquid nozzle 9 is an example of a polymer-containing liquid supply member that supplies a polymer-containing liquid to the substrate W held by the spin chuck 5. The removing-liquid nozzle 10 is an example of a removing liquid supply member that supplies a removing liquid to the substrate W held by the spin chuck 5. The rinsing-liquid nozzle 11 is an example of a rinsing-liquid supply member that supplies a rinsing liquid to the substrate W held by the spin chuck 5.

The plurality of processing liquid nozzles are each moved in a direction (horizontal direction) along the upper surface of the substrate W by means of the plurality of nozzle driving mechanisms (first nozzle driving mechanism 25, second nozzle driving mechanism 26, and third nozzle driving mechanism 27).

Each of the nozzle driving mechanisms is capable of moving a corresponding nozzle between a central position and a retreat position. The central position is a position in which the nozzle faces a central region of the upper surface of the substrate W. The central region of the upper surface of the substrate W is a region that includes a rotational center (center portion CP) and a part around the rotational center in the upper surface of the substrate W. The retreat position is a position in which the nozzle does not face the upper surface of the substrate W, and is a position outside the processing cup 7.

Each of the nozzle driving mechanisms includes an arm (not shown) that supports a corresponding nozzle and an arm driving mechanism (not shown) that moves a corresponding arm in a direction (horizontal direction) along the upper surface of the substrate W. Each of the arm driving mechanisms includes an actuator such as an electric motor or an air cylinder.

Each of the processing liquid nozzles may be a turnable nozzle that turns around a predetermined turning axis, or may be a linearly-movable nozzle that linearly moves in a direction in which a corresponding arm extends. Each of the processing liquid nozzles may be configured to be also movable in a vertical direction.

A polymer-containing liquid discharged from the polymer-containing liquid nozzle 9 contains a polymer, a photoacid generator, and a solvent.

The photoacid generator contained in the polymer-containing liquid has the property of generating an acid by irradiating light L. The photoacid generator is, for example, a sulfonium-salt-based or iodonium-salt-based or non-ion-based photoacid generator. The sulfonium-salt-based photoacid generator is an onium salt in which sulfonium ions are a cation portion. The iodonium-salt-based photoacid generator is an onium salt in which iodonium ions are a cation portion. The onium salt serving as a photoacid generator is composed of a cation portion that absorbs light L irradiated onto the photoacid generator and an anion portion that serves as a generation source of an acid.

The photoacid generator contains any one of, for example, N-hydroxy-1,8-naphthalimide, trifluoromethane sulfonic acid-1,8-naphthalimide, and tris-(4-methylphenyl) sulfonium trifluoromethanesulfonate.

Preferably, the polymer contained in the polymer-containing liquid is a polymer that has the property of increasing the viscosity of the polymer-containing liquid. The polymer contains at least one among, for example, polyvinylpyrrolidone, polyethylene glycol, and polyacrylic-acid-based polymer. The polyacrylic-acid-based polymer is sodium polyacrylate, or polyacrylic acid, or ammonium polyacrylate.

The solvent contained in the polymer-containing liquid has the property of dissolving a photoacid generator and a polymer. The solvent is, for example, a rinsing liquid such as DIW (deionized water), an organic solvent such as IPA, or a mixed liquid of these substances.

The rinsing liquid is, for example, water such as DIW (deionized water). However, the rinsing liquid is not limited to DIW. Without being limited to DIW, the rinsing liquid is DIW, carbonic water, electrolyzed ion water, hydrochloric acid water having a diluted concentration (for example, not less than 1 ppm and not more than 100 ppm), ammonia water having a diluted concentration (for example, not less than 1 ppm and not more than 100 ppm), or restoration water.

The organic solvent contains at least one kind among alcohols such as ethanol (EtOH) or isopropanol (IPA), ethylene glycol monoalkyl ethers such as ethylene glycol monomethyl ether or ethylene glycol monoethyl ether, ethylene glycol monoalkyl ether acetates such as ethylene glycol monomethyl ether acetate or ethylene glycol monoethyl ether acetate, propylene glycol monoalkyl ethers such as propylene glycol methyl ether (PGME) or propylene glycol monoethyl ether (PGEE), lactic acid esters such as methyl lactate or ethyl lactate (EL), aromatic hydrocarbons such as toluene or xylene, and ketones such as acetone, methyl ethyl ketone, 2-heptanone, or cyclohexanone.

A polymer-containing liquid pipe 40 is connected to the polymer-containing liquid nozzle 9, and guides a polymer-containing liquid to the polymer-containing liquid nozzle 9. A polymer-containing liquid valve 50 that opens and closes the polymer-containing liquid pipe 40 is provided in the polymer-containing liquid pipe 40. A continuous flow of the polymer-containing liquid is discharged from the polymer-containing liquid nozzle 9 when the polymer-containing liquid valve is opened.

The fact that the polymer-containing liquid valve 50 is provided in the polymer-containing liquid pipe 40 may denote the fact that the polymer-containing liquid valve 50 is interposed in the polymer-containing liquid pipe 40. The same applies to other valves described below.

The polymer-containing liquid valve 50 includes a valve body within which a valve seat is provided, a valving element that opens and closes the valve seat, and an actuator that moves the valving element between an open position and a closed position (which are not shown). The other valves have similar configuration.

At least one part of the solvent is evaporated from a polymer-containing liquid supplied to the upper surface of the substrate W, and, as a result, the polymer-containing liquid on the substrate W changes into a semisolid or solid polymer film. The term "semisolid" denotes a state in which a solid constituent and a liquid constituent are mixed together or a state in which the film is enabled to have such a viscosity as to keep a predetermined shape on the substrate W.

The term "solid" denotes a state in which the polymer film does not contain a liquid constituent and is formed of only a solid constituent. A polymer film in which a solvent remains is referred to as a semi-solid film, and a polymer film in which a solvent has been completely eliminated is referred to as a solid film. The polymer film is a semi-solid film or a solid film, and therefore the polymer film does not spread on the upper surface of the substrate W, and remains at a position when formed.

The removing liquid discharged from the removing-liquid nozzle 10 is a liquid that removes the polymer film from the upper surface of the substrate W. In detail, the removing liquid removes the polymer film from the upper surface of the substrate W by means of at least either one of dissolving and decomposing of the polymer film. The polymer film remaining on the upper surface of the substrate W may be removed from the upper surface of the substrate W by being extruded outwardly from the substrate by means of energy that acts from a liquid current of the removing liquid.

The removing liquid discharged from the removing-liquid nozzle 10 is, for example, a rinsing liquid such as DIW, an organic solvent such as IPA, EtOH, or acetone, a tetramethylammonium hydroxide liquid (TMAH liquid), a mixed liquid of these liquids. The TMAH liquid may be an aqueous solution of tetramethylammonium hydroxide, or may be a methanolic solution of tetramethylammonium hydroxide.

A liquid mentioned as a rinsing liquid used as a solvent of the polymer film containing liquid can be used as the removing liquid. A liquid mentioned as an organic solvent used as a solvent of the polymer film containing liquid can be used as the removing liquid. In other words, the same liquid as the solvent of the polymer film containing liquid can be used as the removing liquid.

A removing liquid pipe 41 that guides a removing liquid to the removing-liquid nozzle 10 is connected to the removing-liquid nozzle 10. A removing-liquid valve 51 that opens and closes the removing liquid pipe 41 is provided in the removing liquid pipe 41. A continuous flow of the removing liquid is discharged from the removing-liquid nozzle 10 when the removing-liquid valve 51 is opened.

The rinsing liquid discharged from the rinsing-liquid nozzle 11 is, for example, water such as DIW (deionized water). The liquid mentioned as the rinsing liquid used as the solvent of the polymer-containing liquid can be used as the rinsing liquid discharged from the rinsing-liquid nozzle 11.

The rinsing-liquid pipe 42 that guides the rinsing liquid to the rinsing-liquid nozzle 11 is connected to the rinsing-liquid nozzle 11. A rinsing-liquid valve 52 that opens and closes the rinsing-liquid pipe 42 is provided in the rinsing-liquid pipe 42. A continuous flow of the rinsing liquid is discharged from the rinsing-liquid nozzle 11 when the rinsing-liquid valve 52 is opened.

The processing cup 7 includes a plurality of (in FIG. 2, two) guards 28 that catch the processing liquid spattering outwardly from the substrate W held by the spin chuck 5, a plurality of (in FIG. 2, two) cups 29 that catch the processing liquid downwardly guided by the plurality of guards 28, and a circular cylindrical outer-wall member 30 surrounding the plurality of guards 28 and the plurality of cups 29.

Each of the guards 28 has a cylindrical form surrounding the spin chuck 5 in a plan view. An upper end portion of each of the guards 28 is inclined so as to face the inside of the guard 28. Each of the cups 29 has an annular groove form that is upwardly open. The plurality of guards 28 and the plurality of cups 29 are disposed coaxially.

The plurality of guards 28 are individually moved in an up-and-down direction by means of a guard elevation driving mechanism (not shown). The guard elevation driving mechanism includes, for example, a plurality of actuators that drive and move the plurality of guards 28, respectively, in the up-and-down direction. The plurality of actuators include at least either one of an electric motor and an air cylinder.

The light emission member 12 includes, for example, a light source 60 that emits light L and a housing 61 that houses the light source 60. For example, the light emission member 12 is supported by the upper wall **4*a* of the chamber 4. The upper wall 4*a* is an example of a supporting wall that faces the upper surface of the substrate W held by the spin chuck 5 and that supports the light source 60. The housing 61 is attached to the upper wall 4*a* of the chamber 4**.

Light L emitted from the light source 60 passes through the upper wall **4*a* of the chamber 4 and through the housing 61, and is irradiated onto a peripheral edge portion of the upper surface of the substrate W held by the spin chuck 5 in the chamber 4. Part, through which light L passes, of both the upper wall 4*a* of the chamber 4 and the housing 61** is made of a transmissive member, such as quartz, having light transparency.

The light L emitted from the light source 60 is ultraviolet light having a wavelength of, for example, not less than 1 nm and not more than 400 nm. The light L emitted from the light source 60 is merely required to be light that generates an acid by being irradiated onto a photoacid generator without being limited to ultraviolet light. The light may be, for example, infrared light or visible light.

The light source 60 is, for example, a laser light source that emits a laser beam. The laser light source is, for example, an excimer lamp that emits an excimer laser. For example, ArF excimer laser (wavelength: 193 nm), KrF excimer laser (wavelength: 248 nm), XeCl excimer laser (wavelength: 308 nm), XeF excimer laser (wavelength: 351 nm), etc., can be mentioned as the excimer laser.

The light L emitted from the light source 60 is not limited to the laser beam. Preferably, the light emitted from the light source 60 is light that has directivity. The light source 60 is not limited to the laser light source such as an excimer lamp, and may be, for example, a xenon lamp, a mercury lamp, a heavy hydrogen lamp, an LED lamp, etc. An energizing unit 62, such as a power source, is connected to the light emission member 12, and light L is emitted from the light emission member 12 by supplying electric power from the energizing unit 62.

The reflection suppression member 13 is made of, for example, an optical absorption material that absorbs stray light and scattered light. Therefore, the reflection suppression member 13 can be reworded as an optical absorption member. The optical absorption material is, for example, a carbon resin. The reflection suppression member 13 is not required to be made of the optical absorption material in its entirety, and only the surface of the reflection suppression member 13 may be made of the optical absorption material.

The reflection suppression member 13 is moved by a reflection suppression member driving mechanism 31 in a direction (horizontal direction) along the upper surface of the substrate W. The reflection suppression member driving mechanism 31 is capable of moving the reflection suppression member 13 between a peripheral position (position shown in FIG. 3A described later) and the retreat position. The peripheral position is a position at which the reflection suppression member 13 faces the peripheral edge portion of the upper surface of the substrate W. The retreat position is a position at which the reflection suppression member 13 does not face the upper surface of the substrate W, and is a position outside the processing cup 7.

The reflection suppression member driving mechanism 31 includes an arm 32 that supports the reflection suppression member 13 and an arm driving mechanism 33 that moves the reflection suppression member 13 in the direction (horizontal direction) along the upper surface of the substrate W. The arm driving mechanism 33 includes an actuator such as an electric motor or an air cylinder.

The reflection suppression member 13 may be a turnable reflection suppression member that turns around a predetermined turning axis, or may be a linearly-movable reflection suppression member that linearly moves in a direction in which a corresponding arm extends. The reflection suppression member 13 may be configured to be also movable in the vertical direction.

<Configuration of Reflection Suppression Member>

Figure 3A:
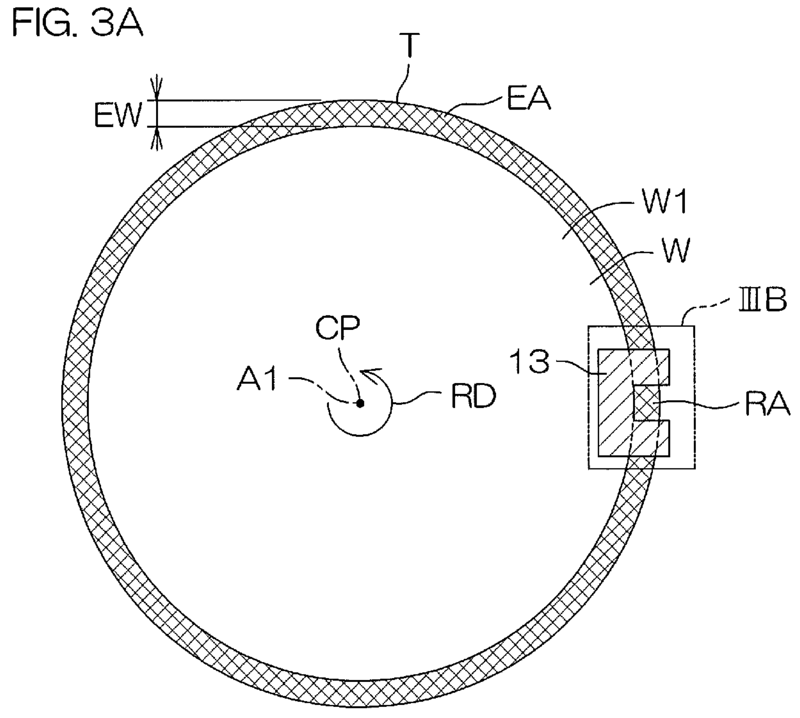
FIG. 3A is a cross-sectional view along line IIIA-IIIA shown in FIG. 2.
Figure 3B:
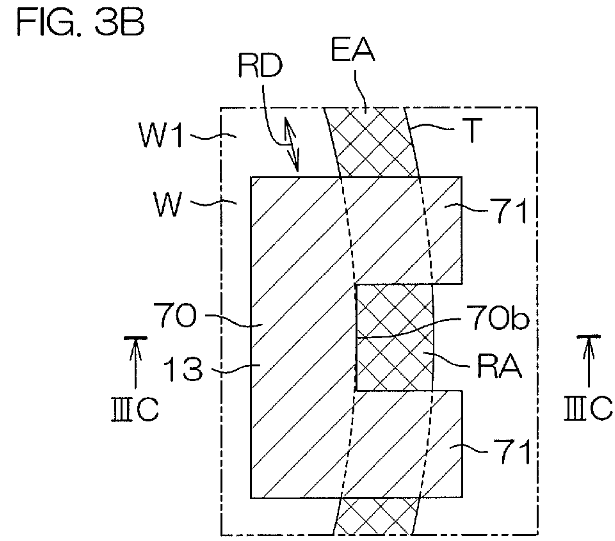
FIG. 3B is an enlarged view of region IIIB shown in FIG. 3A.
Figure 3C:
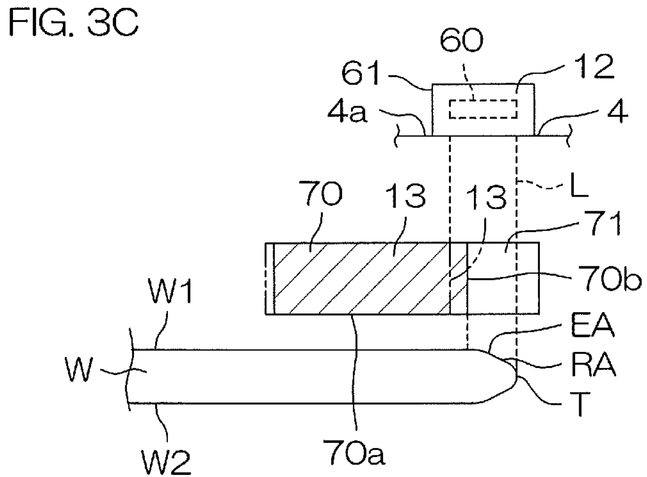
FIG. 3C is a cross-sectional view along line IIIC-IIIC shown in FIG. 3B.

FIG. 3A is a cross-sectional view along line IIIA-IIIA shown in FIG. 2. FIG. 3B is an enlarged view of region IIIB shown in FIG. 3A. FIG. 3C is a cross-sectional view along line IIIC-IIIC shown in FIG. 3B. In FIG. 3A and FIG. 3B, for clarity, a double oblique line is given to a to-be-etched region (etched region EA) of the peripheral edge portion of the upper surface of the substrate W (details will be described later). The same depiction will be made in other drawings if necessary.

Based on a reference position located on a more inward side than a peripheral edge T when seen from a direction orthogonal to the upper surface of the substrate W, the center portion CP side with respect to the reference position will be hereinafter referred to as a radially inward side if necessary. Likewise, the peripheral edge T side with respect to the reference position will be hereinafter referred to as a radially outward side if necessary. The peripheral edge T side of the substrate W is a side opposite to the center portion CP.

The light emission member 12 irradiates light L onto a region (to-be-irradiated region) on the upper surface of the substrate W adjacent to the reflection suppression member 13 from the radially outward side with respect to the reflection suppression member 13. A region, onto which light L emitted from the light emission member 12 is irradiated, of the peripheral edge portion of the upper surface of the substrate W is referred to as an irradiation region RA. Light L emitted from the light emission member 12 is irradiated onto a predetermined range in a rotation direction RD in the peripheral edge portion of the upper surface of the substrate W. Therefore, the irradiation region RA is a region over the predetermined range in the rotation direction RD around the rotational axis A1 in the peripheral edge portion of the upper surface of the substrate W. The region over the predetermined range is a region that is not over the entire periphery in the rotation direction RD and that is over a range smaller than 360° in the rotation direction RD.

Light L is emitted from the light emission member 12 while rotating the substrate W around the rotational axis A1, and, as a result, the light L is enabled to be irradiated onto the entire periphery of the peripheral edge portion of the upper surface of the substrate W.

The reflection suppression member 13 includes a first portion 70 that can be placed at an adjoining position and a pair of second portions 71 that are connected to the first portion 70 and that adjoin the irradiation region RA from both sides, respectively, of the rotation direction RD when the first portion 70 is placed at the adjoining position. The first portion 70 is placed at the adjoining position when the reflection suppression member 13 is placed at the peripheral position.

The adjoining position is a position adjoining the irradiation region RA from the center portion CP side of the upper surface of the substrate W. In other words, the adjoining position is a position that adjoins the irradiation region RA and that is closer to the center portion CP than the irradiation region RA. The adjoining position is, for example, an intercept position at which part of the light L emitted from the light emission member 12 is intercepted by the first portion 70. The adjoining position may be a position at which the entirety of the light L emitted from the light emission member 12 is irradiated onto the upper surface of the substrate W without the fact that the light L is intercepted by the first portion 70 as shown by an alternate long and two short dashed line in FIG. 3C.

The first portion 70 has a facing surface 70*a* that faces the upper surface of the substrate W in a state parallel to the upper surface of the substrate W when the first portion 70 is placed at the adjoining position and an orthogonal surface 70*b* that is connected to the facing surface 70*a* and that is orthogonal to the facing surface 70*a*.

<Electrical Configuration of Substrate Processing According to First Preferred Embodiment>

FIG. 4 is a block diagram for describing an electrical configuration of the substrate processing apparatus 1. The controller 3 includes a microcomputer, and controls to-be-controlled components included in the substrate processing apparatus 1 in accordance with a predetermined control program.

In detail, the controller 3 includes a processor 3A (CPU) and a memory 3B in which the control program is stored. The controller 3 is configured to perform various control operations for substrate processing by allowing the processor 3A to execute the control program.

Particularly, the controller 3 is programmed to control the first transfer robot IR, the second transfer robot CR, the rotation driving mechanism 20, the first nozzle driving mechanism 25, the second nozzle driving mechanism 26, the third nozzle driving mechanism 27, the reflection suppression member driving mechanism 31, the energizing unit 62, the suction valve 23, the polymer-containing liquid valve 50, the removing-liquid valve 51, the rinsing-liquid valve 52, etc.

The valves are controlled by the controller 3, and, as a result, the presence or absence of the discharge of a fluid from a corresponding nozzle or a flow amount of a fluid discharged from a corresponding nozzle is controlled.

Each step described below is performed by allowing the controller 3 to control each member included in the substrate processing apparatus 1. In other words, the controller 3 is programmed to perform each step described below.

Additionally, although typical members are shown in FIG. 4, this does not denote that members not shown in FIG. 4 are not controlled by the controller 3, and the controller 3 can appropriately control each member included in the substrate processing apparatus 1. Members of each modification described later and of a second preferred embodiment described later are shown as well in FIG. 4, and these members are also controlled by the controller 3.

One Example of Substrate Processing

Figure 5:
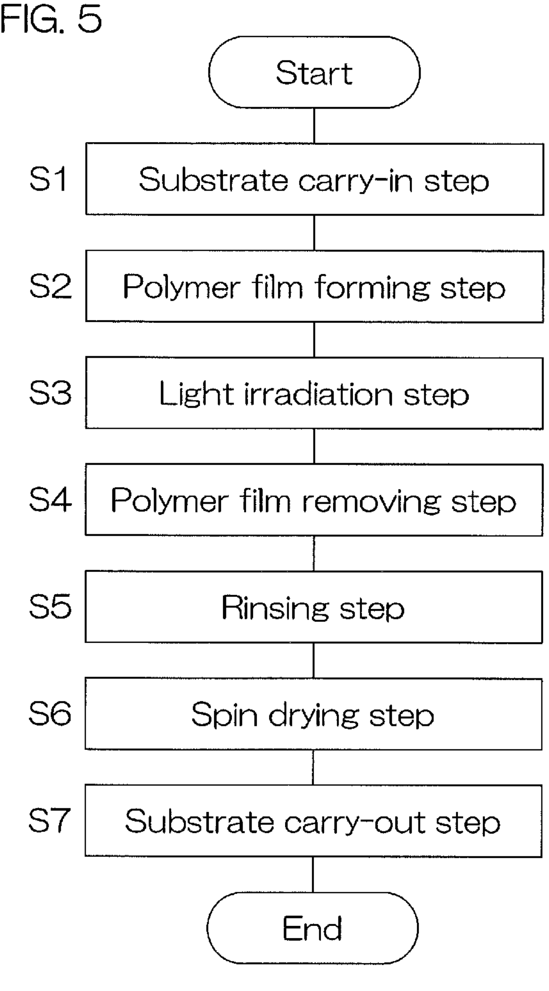
FIG. 5 is a flowchart for describing an example of substrate processing performed by the substrate processing apparatus.
Figure 6A:
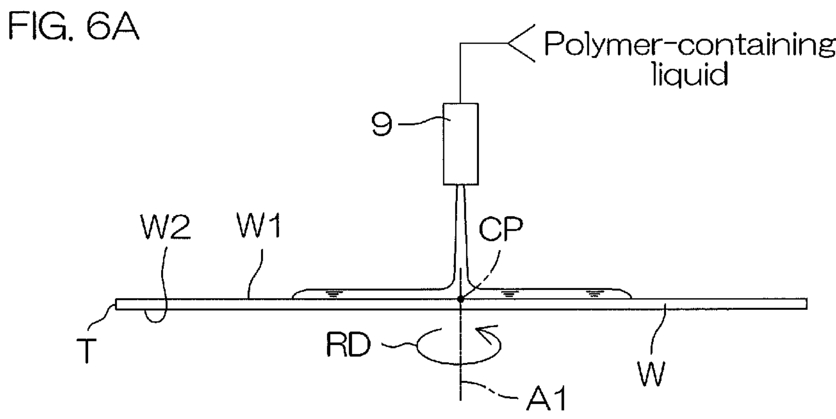
FIG. 6A is a schematic view for describing an aspect of both a substrate and its surroundings when the substrate processing is being performed.
Figure 6B:
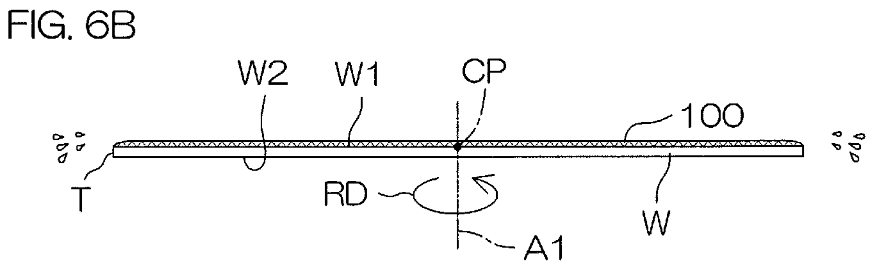
FIG. 6B is a schematic view for describing an aspect of both the substrate and its surroundings when the substrate processing is being performed.
Figure 6C:
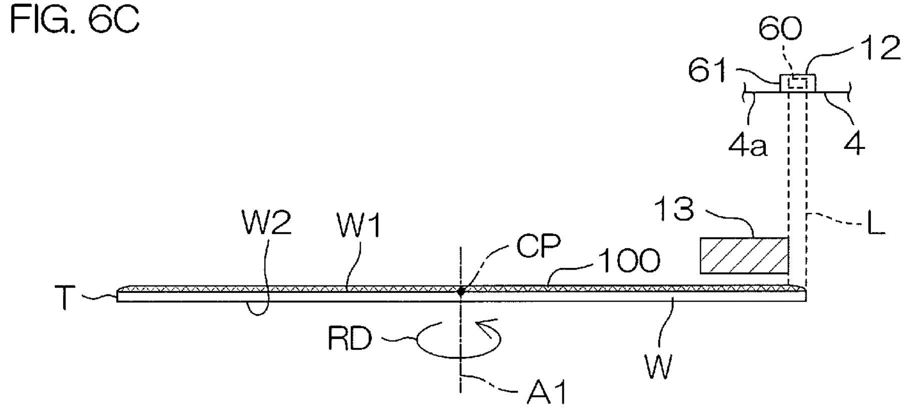
FIG. 6C is a schematic view for describing an aspect of both the substrate and its surroundings when the substrate processing is being performed.

FIG. 5 is a flowchart for describing an example of substrate processing performed by the substrate processing apparatus 1. FIG. 6A to FIG. 6C are schematic views each of which describes an aspect of the substrate W and of its surroundings when substrate processing is performed.

In substrate processing performed by the substrate processing apparatus 1, a substrate carry-in step (Step S1), a polymer film forming step (Step S2), a light irradiation step (Step S3), a polymer film removing step (Step S4), a rinsing step (Step S5), a spin drying step (Step S6), and a substrate carry-out step (Step S7) are performed as shown in, for example, FIG. 5. Substrate processing will be hereinafter described in detail with reference chiefly to FIG. 2 and FIG. 5. Reference is appropriately made to FIG. 6A to FIG. 6C.

First, a substrate W that has not yet been processed is transferred from the carrier C to the processing unit 2 by means of the first transfer robot IR and the second transfer robot CR (see FIG. 1), and is delivered to the spin chuck 5 (substrate carry-in step: Step S1). Thereby, the substrate W is held in a processing posture by means of the spin chuck 5 (substrate holding step). At this time, the substrate W is held by the spin chuck 5 so that the first principal surface W1 is an upper surface. The substrate W continues being held by the spin chuck 5 until the spin drying step (Step S6) is ended. The rotation driving mechanism 20 starts rotating the substrate W in a state in which the substrate W is held by the spin chuck 5 (substrate rotating step).

The second transfer robot CR recedes from the chamber 4, and then the polymer film forming step (Step S2) of forming a polymer film 100 (see FIG. 6B) on the upper surface of the substrate W is performed.

In detail, the first nozzle driving mechanism 25 moves the polymer-containing liquid nozzle 9 to the processing position. The processing position of the polymer-containing liquid nozzle 9 is, for example, the central position. The polymer-containing liquid valve 50 is opened in a state in which the polymer-containing liquid nozzle 9 is placed at the processing position. Thereby, a polymer-containing liquid is supplied (discharged) from the polymer-containing liquid nozzle 9 toward the central region of the upper surface of the substrate W as shown in FIG. 6A (polymer-containing liquid supplying step, polymer-containing liquid discharging step). The polymer-containing liquid discharged from the polymer-containing liquid nozzle 9 lands on the central region of the upper surface of the substrate W.

The substrate W may be rotated at a low speed (for example, 10 rpm) when the polymer-containing liquid is supplied to the upper surface of the substrate W (low speed rotating step). Alternatively, the rotation of the substrate W may be stopped when the polymer-containing liquid is supplied to the upper surface of the substrate W. The polymer-containing liquid supplied to the substrate W remains in the central region of the upper surface of the substrate W by reducing the rotation speed of the substrate W so as to be rotated at a low speed or by stopping the rotation of the substrate W. This makes it possible to make the amount of the polymer-containing liquid used smaller than in a case in which the polymer-containing liquid on the upper surface of the substrate W is discharged outwardly from the substrate W while rotating the substrate W at a high speed.

The polymer-containing liquid is supplied to the upper surface of the substrate W during a predetermined period of time, and then the polymer-containing liquid valve 50 is closed, and the discharge of the polymer-containing liquid from the polymer-containing liquid nozzle 9 is stopped. The polymer-containing liquid valve 50 is closed, and then the polymer-containing liquid nozzle 9 is moved to the retreat position by means of the first nozzle driving mechanism 25.

The polymer-containing liquid valve 50 is closed, and then the rotation of the substrate W is accelerated so that the rotation speed of the substrate W reaches a predetermined spin-off speed (rotation accelerating step). The spin-off speed is, for example, 1500 rpm. The rotation of the substrate W at the spin-off speed is continued, for example, for 30 seconds.

The polymer-containing liquid remaining in the central region of the upper surface of the substrate W is spread toward the peripheral edge portion of the upper surface of the substrate W, and is spread throughout the entirety of the upper surface of the substrate W by means of a centrifugal force caused by the rotation of the substrate W. Part of the polymer-containing liquid on the substrate W is spattered outwardly from the peripheral edge portion of the substrate W, and a liquid film of the polymer-containing liquid on the substrate W is thinned (spin-off step). The polymer-containing liquid on the upper surface of the substrate W is not required to be spattered outwardly from the substrate W, and is merely required to be spread throughout the entirety of the upper surface of the substrate W by means of the action of the centrifugal force of the rotation of the substrate W.

The centrifugal force caused by the rotation of the substrate W acts on not only the polymer-containing liquid on the substrate W but also a gas contiguous to the polymer-containing liquid on the substrate W. Therefore, a gas-flow is formed in which the gas flows from the center portion CP side toward the peripheral edge T side of the upper surface of the substrate W by means of the action of the centrifugal force. Because of this gas-flow, a gaseous solvent contiguous to the polymer-containing liquid on the substrate W is excluded from an atmosphere contiguous to the substrate W. Therefore, the evaporation (volatilization) of the solvent from the polymer-containing liquid on the substrate W is facilitated, and the polymer film 100 is formed as shown in FIG. 6B (polymer film forming step). Thus, the polymer-containing liquid nozzle 9 functions as a polymer film forming member.

The polymer film 100 is higher in viscosity than the polymer-containing liquid, and hence remains on the substrate W without being completely excluded from on the substrate W although the substrate W is rotating. In this preferred embodiment, the polymer-containing liquid remaining in the central region of the upper surface of the substrate W is painted and spread on the entirety of the upper surface of the substrate W by means of the centrifugal force, and, as a result, the polymer film 100 is formed. Therefore, it is possible to make the amount of the polymer-containing liquid used smaller than in a case in which the polymer-containing liquid continues being discharged from the polymer-containing liquid nozzle 9 until the polymer-containing liquid is spread throughout the entirety of the upper surface of the substrate W.

The substrate W may make high-speed rotation at a spin-off speed from when the polymer-containing liquid starts being supplied.

The polymer film 100 is formed on the upper surface of the substrate W, and then the light irradiation step (Step S3) of irradiating light L onto the peripheral edge portion of the upper surface of the substrate W is performed. In detail, the reflection suppression member driving mechanism 31 moves the reflection suppression member 13 to the peripheral position. Electric power is supplied from the energizing unit 62 to the light emission member 12 in a state in which the reflection suppression member 13 is placed at the peripheral position as shown in FIG. 6C, and, as a result, light L is irradiated onto the peripheral edge portion of the upper surface of the substrate W (irradiating step). An acid is generated in the polymer film 100 over the irradiation region RA. The peripheral edge portion of the upper surface of the substrate W is etched by the acid generated therein (etching step). In other words, the acid generated in the polymer film 100 functions as an etching agent.

Preferably, the polymer film 100 is a semi-solid film. If the polymer film 100 is a semi-solid film, the acid that is an electrolyte easily emits protons at the polymer film 100. Thereby, it is possible to facilitate etching.

The irradiation region RA is a region within a predetermined range in the rotation direction RD around the rotational axis A1. The substrate W is being rotated during the irradiation of light L onto the upper surface of the substrate W. Therefore, it is possible to irradiate light onto the peripheral edge portion of the upper surface of the substrate W all over in its entire periphery, and it is possible to etch the peripheral edge portion of the upper surface of the substrate W all over in its entire periphery. A region (etching region EA), in which etching is performed, of the peripheral edge portion of the upper surface of the substrate W assumes an annular shape in a plan view (see FIG. 3A).

Light L is irradiated onto the peripheral edge portion of the upper surface of the substrate W during a predetermined period of time, and then the polymer film removing step (Step S4) is performed in which the polymer film 100 is removed from the upper surface of the substrate W while supplying a removing liquid to the upper surface of the substrate W.

In detail, the energizing unit 62 stops supplying electric power to the light emission member 12, and the reflection suppression member 13 is moved to the retreat position. Instead, the second nozzle driving mechanism 26 moves the removing-liquid nozzle 10 to the processing position. The processing position of the removing-liquid nozzle 10 is, for example, the central position. The removing-liquid valve 51 is opened in a state in which the removing-liquid nozzle 10 is placed at the processing position. Thereby, a removing liquid is supplied (discharged) from the removing-liquid nozzle 10 toward the central region of the upper surface of the substrate W (removing liquid supplying step, removing liquid discharging step).

The removing liquid discharged from the removing-liquid nozzle 10 lands on the central region of the upper surface of the substrate W. The removing liquid that has landed on the upper surface of the substrate W is spread to the entirety of the upper surface of the substrate W by means of the action of the centrifugal force. The removing liquid on the substrate W is spattered outwardly from the peripheral edge portion of the substrate W. The polymer film 100 on the substrate W is excluded outwardly from the substrate W together with the removing liquid.

The removing liquid is supplied to the upper surface of the substrate W during a predetermined period of time, and then the rinsing step (Step S5) is performed in which the upper surface of the substrate W is rinsed while supplying a rinsing liquid to the upper surface of the substrate W.

In detail, the removing-liquid valve 51 is closed, and the removing liquid stops being supplied, and the second nozzle driving mechanism 26 allows the removing-liquid nozzle 10 to recede to the retreat position. Instead, the third nozzle driving mechanism 27 moves the rinsing-liquid nozzle 11 to the processing position. The processing position of the rinsing-liquid nozzle 11 is, for example, the central position. The rinsing-liquid valve 52 is opened in a state in which the rinsing-liquid nozzle 11 is placed at the processing position. Thereby, a rinsing liquid is supplied (discharged) from the rinsing-liquid nozzle 11 toward the central region of the upper surface of the substrate W (rinsing liquid supplying step, rinsing liquid discharging step).

The rinsing liquid discharged from the rinsing-liquid nozzle 11 lands on the central region of the upper surface of the substrate W. The rinsing liquid that has landed on the upper surface of the substrate W is spread to the entirety of the upper surface of the substrate W by means of the action of the centrifugal force. The rinsing liquid on the substrate W is spattered outwardly from the peripheral edge portion of the substrate W. Thereby, the upper surface of the substrate W is rinsed.

Thereafter, the spin drying step (Step S6) is performed in which the upper surface of the substrate W is dried while rotating the substrate W at a high speed. In detail, the rinsing-liquid valve 52 is closed, and the rinsing liquid stops being supplied to the upper surface of the substrate W, and the third nozzle driving mechanism 27 allows the rinsing-liquid nozzle 11 to recede to the retreat position. Thereafter, the rotation driving mechanism 20 accelerates the rotation of the substrate W, and rotates the substrate W at a high speed (for example, 1500 rpm). Thereby, a great centrifugal force acts on the rinsing liquid adhering to the substrate W, and the rinsing liquid is shaken off toward the surroundings of the substrate W.

The spin drying step (Step S6) is completed, and then the rotation driving mechanism 20 stops rotating the substrate W. Thereafter, the second transfer robot CR enters the processing unit 2, and receives the substrate W, which has already been processed, from the spin chuck 5, and carries this substrate W out of the processing unit 2 (substrate carry-out step: Step S7). The substrate W is delivered from the second transfer robot CR to the first transfer robot IR, and is housed in the carrier C by means of the first transfer robot IR.

<Change of Peripheral Edge Portion of Upper Surface of Substrate During Substrate Processing>

FIG. 7A to FIG. 7E are schematic views for describing a change of the peripheral edge portion of the upper surface of the substrate W during substrate processing.

Figure 7A:
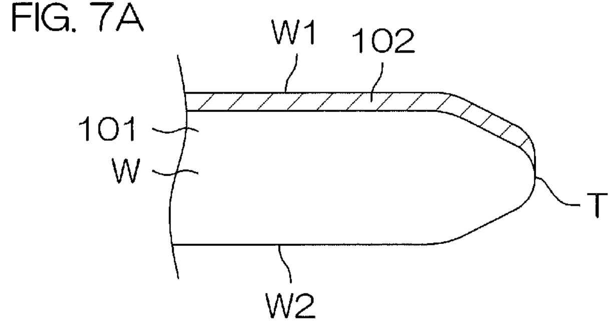
FIG. 7A is a schematic view for describing a change in a peripheral edge portion of the substrate while the substrate processing is being performed.

FIG. 7A shows a state of the peripheral edge portion of the substrate W that has not yet been subjected to substrate processing. The peripheral edge portion of the substrate W is referred to also as a bevel portion. The peripheral edge portion of the upper surface of the substrate W is an upper surface of the bevel portion, and the peripheral edge portion of the lower surface of the substrate W is a lower surface of the bevel portion.

The substrate W includes, for example, a semiconductor layer 101 and a to-be-processed film 102 formed on the semiconductor layer 101 as shown in FIG. 7A. The to-be-processed film 102 is exposed at least in the peripheral edge portion of the upper surface of the substrate W. The to-be-processed film 102 may be exposed in the whole area of the upper surface of the substrate W. The to-be-processed film 102 is made of, for example, SiN (silicon nitride), TiN (titanium nitride), $SiO_2$ (silicon oxide), W (tungsten), or the like.

Unlike this preferred embodiment, instead of the semiconductor layer 101, a layered structure consisting of at least any one among a semiconductor layer, an insulation layer, and a metal layer may be provided, or a single-layer structure consisting of a semiconductor layer, an insulation layer, or a metal layer may be provided.

Figure 7B:
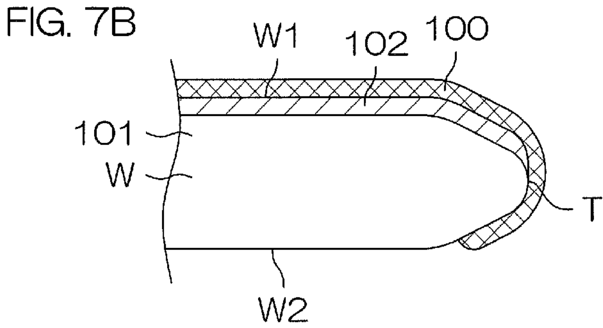
FIG. 7B is a schematic view for describing a change in the peripheral edge portion of the substrate while the substrate processing is being performed.

FIG. 7B shows a state of the peripheral edge portion of the upper surface of the substrate W after the polymer film forming step (Step S2) is completed. The polymer film 100 is formed on the upper surface of the substrate W by performing the polymer film forming step as shown in FIG. 7B. In this substrate processing, the polymer film 100 is formed on the entirety of the upper surface of the substrate W. The polymer-containing liquid supplied to the upper surface of the substrate W in the polymer film forming step moves to the peripheral edge portion of the lower surface of the substrate W via the peripheral edge T (front end) of the substrate W. Therefore, the polymer film 100 is also formed on the peripheral edge portion of the lower surface of the substrate W as shown in FIG. 7B.

Figure 7C:
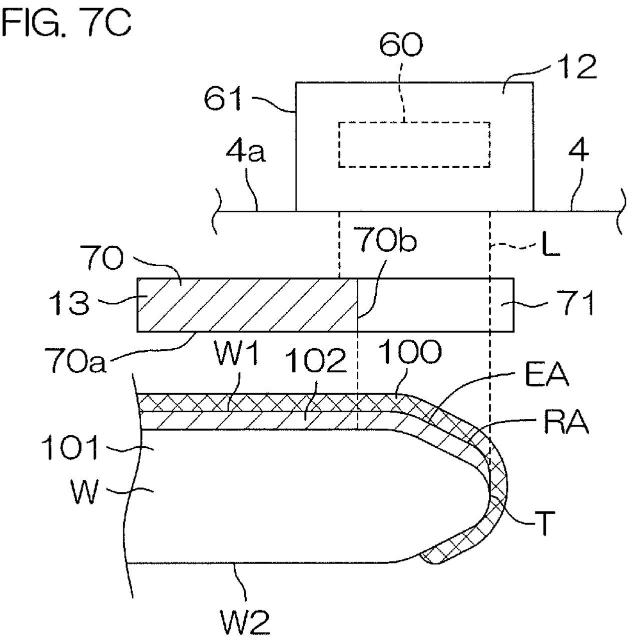
FIG. 7C is a schematic view for describing a change in the peripheral edge portion of the substrate while the substrate processing is being performed.

FIG. 7C shows a state of the peripheral edge portion of the substrate W to which the light irradiation step (Step S3) is being applied. A state in which the reflection suppression member 13 is placed at the intercept position in the light irradiation step is shown in FIG. 7C. The reflection suppression member 13 is placed at the intercept position, and, as a result, it is possible to make the irradiation region RA smaller than in a case in which the reflection suppression member 13 is placed at a position at which part of the light L is not intercepted by the reflection suppression member 13. In other words, it is possible to adjust the size of the irradiation region RA (irradiation region adjusting step).

Figure 7D:
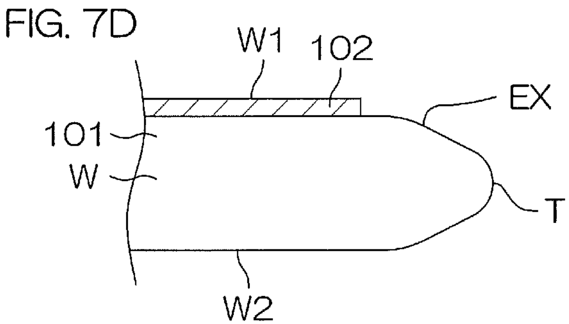
FIG. 7D is a schematic view for describing a change in the peripheral edge portion of the substrate while the substrate processing is being performed.

FIG. 7D shows a state of the peripheral edge portion of the substrate W that has been subjected to substrate processing. Light L is irradiated onto the peripheral edge portion of the upper surface of the substrate W, and, as a result, an acid generated in the polymer film 100 dissolves (etches) at least one part of the to-be-processed film 102. Therefore, the to-be-processed film 102 that has been etched is discharged outwardly from the substrate W together with the polymer film 100 by means of the removing liquid supplied to the upper surface of the substrate W after light irradiation. As a result, the to-be-processed film 102 is removed from the region (etching region EA), onto which light L has been irradiated, of the peripheral edge portion of the upper surface of the substrate W as shown in FIG. 7D.

Summary of First Preferred Embodiment

According to the first preferred embodiment of the present invention, the polymer film 100 is formed on the upper surface of the substrate W by means of the polymer-containing liquid nozzle 9. Light L emitted from the light emission member 12 is irradiated onto the peripheral edge portion of the upper surface of the substrate W in a state in which the polymer film 100 is formed on the upper surface of the substrate W, and, as a result, it is possible to generate an acid in the polymer film 100. The peripheral edge portion of the upper surface of the substrate W is etched by the acid generated in the polymer film 100. As thus described, the region (irradiation region RA), onto which light L has been irradiated, of the peripheral edge portion of the upper surface of the substrate W is etched.

A polymer is contained in the polymer film 100, and therefore the fluidity of the polymer film 100 is reduced. Therefore, an acid generated in the polymer film 100 easily remains at the position of generation. Therefore, it is possible to accurately control the width of a region (etching region EA), in which etching is performed, of the peripheral edge portion of the upper surface of the substrate W, i.e., it is possible to accurately control an etching width EW (see FIG. 3A). The etching width EW corresponds to a distance between the peripheral edge T (front end) and an end portion (center side end portion) of the etching region EA on the center portion CP side. The etching width EW is, for example, not less than 0.5 mm and not more than 5 mm.

According to the first preferred embodiment, the reflection suppression member 13 includes the first portion 70 that is placeable at an adjoining position at which the first portion 70 adjoins the irradiation region RA from the center portion CP side of the upper surface of the substrate W. Therefore, the reflection of light L from the reflection suppression member 13 is suppressed even if the light L is reflected from the irradiation region RA and is irradiated onto the first portion 70. Therefore, it is possible to suppress the light L reflected from the irradiation region RA from being irradiated onto a position closer to the center portion CP of the upper surface than the reflection suppression member 13 in the upper surface of the substrate W. Therefore, it is possible to more precisely control the etching width EW by means of the reflection suppression member 13.

According to the first preferred embodiment, light L is emitted from the light emission member 12 toward a predetermined range in the rotation direction RD in the peripheral edge portion of the upper surface of the substrate W. The light L is irradiated onto the peripheral edge portion of the upper surface of the substrate W while rotating the substrate W, and, as a result, it is possible to etch the peripheral edge portion of the upper surface of the substrate W in the entire periphery. Therefore, the light L is irradiated onto the predetermined range on the peripheral edge portion of the upper surface of the substrate W, and therefore it is possible to make irregular irradiation smaller than in a case in which the light L is simultaneously irradiated onto the whole area of the peripheral edge portion of the upper surface of the substrate W. Therefore, it is possible to accurately control the etching width EW in the entire periphery of the substrate W.

In the first preferred embodiment, etching is performed by irradiating the light L. Unlike the first preferred embodiment, in etching that is performed by use of a continuous flow of an etching liquid, the etching liquid lands on the upper surface of the substrate W, and then is swiftly spread on the upper surface of the substrate W. Additionally, unlike the first preferred embodiment, in etching that is performed by heating, it is difficult to heat only a partial region of the peripheral edge portion of the upper surface of the substrate W.

On the other hand, in the first preferred embodiment, the use of the reflection suppression member 13 makes it possible to suppress light L reflected from the peripheral edge portion of the upper surface of the substrate W from being irradiated onto a position closer to the center portion CP than the first portion 70 of the reflection suppression member 13. Therefore, it is possible to more accurately control the etching width EW than etching that is performed by the continuous flow of the etching liquid and than etching that is performed by heating. Additionally, it is possible to accurately control the etching width EW if a light-emitting member configured to emit a laser beam having directivity is used as the light emission member 12.

Herein, substrate processing is performed, and, as a result, the semiconductor layer 101 is exposed in the peripheral edge portion of the upper surface of the substrate W. Therefore, in dry etching that can be performed after substrate processing performed by the substrate processing apparatus 1, there is a concern that an exposed region EX (see FIG. 7D), in which the semiconductor layer 101 is exposed, of the peripheral edge portion of the upper surface of the substrate W might be damaged. Resulting from the damage, there is a concern that unevenness might occur in the exposed region EX and that particles or the like might enter a depression portion of the uneven structure.

According to the first preferred embodiment, it is possible to accurately control the etching width EW by irradiating the light L, and therefore it is possible to reduce the width of the exposed region EX. Therefore, it is possible to reduce a region damaged by dry etching. Consequently, it is possible to suppress the occurrence of particles. The width of the exposed region EX corresponds to a distance between the peripheral edge T and an inner end in the radial direction of the exposed region EX.

According to the first preferred embodiment, the pair of second portions 71 adjoin the irradiation region RA from both sides, respectively, in the rotation direction RD when the first portion 70 is placed at the adjoining position. Therefore, the reflection of light L from the reflection suppression member 13 is suppressed even if the light L is reflected from the irradiation region RA and is irradiated onto the second portions 71. Therefore, it is possible to suppress the light L reflected from the irradiation region RA from being irradiated onto the side opposite to the irradiation region RA across the reflection suppression member 13 in the rotation direction RD. Therefore, it is possible to more precisely control the etching width EW by the reflection suppression member 13.

According to the first preferred embodiment, the adjoining position of the first portion 70 of the reflection suppression member 13 is the intercept position at which the first portion 70 intercepts part of the light L emitted from the light emission member 12. Therefore, it is possible to control the size of the irradiation region RA by controlling the position of the first portion 70. Thereby, it is possible to control the etching width EW.

According to the first preferred embodiment, the first portion 70 of the reflection suppression member 13 has the facing surface 70*a* that faces the upper surface of the substrate W in a state parallel to the upper surface of the substrate W when the first portion 70 is placed at the adjoining position and the orthogonal surface 70*b* that is connected to the facing surface 70*a* and that is orthogonal to the facing surface 70*a*. Therefore, it is possible to suppress light L emitted from the light emission member 12 from being irradiated onto a position closer to the center portion CP of the upper surface of the substrate W than the orthogonal surface 70*b*. Therefore, it is possible to define the irradiation region RA along the orthogonal surface 70*b*. Therefore, it is possible to accurately control the etching width EW.

According to the first preferred embodiment, the light source 60 is supported by the upper wall 4*a* with respect to the upper surface of the substrate W. Therefore, it is possible to irradiate light L emitted from the light source 60 onto the peripheral edge portion of the upper surface of the substrate W without changing the traveling direction of the light L. Therefore, it is possible to exclude members used to change the traveling direction of the light L.

<Substrate Processing According to First Modification>

Figure 8A:
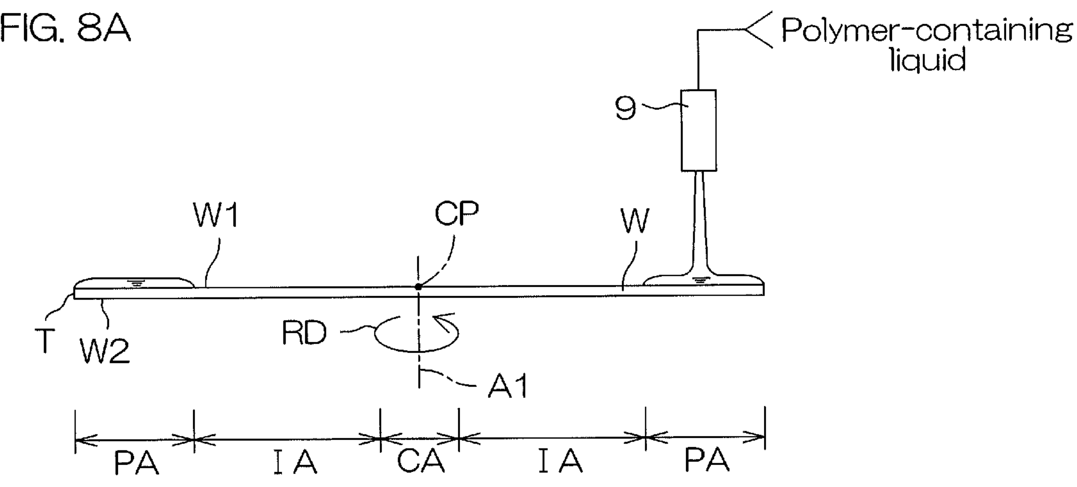
FIG. 8A is a schematic view for describing an aspect of both a substrate and its surroundings when substrate processing according to a first modification is being performed.
Figure 8B:
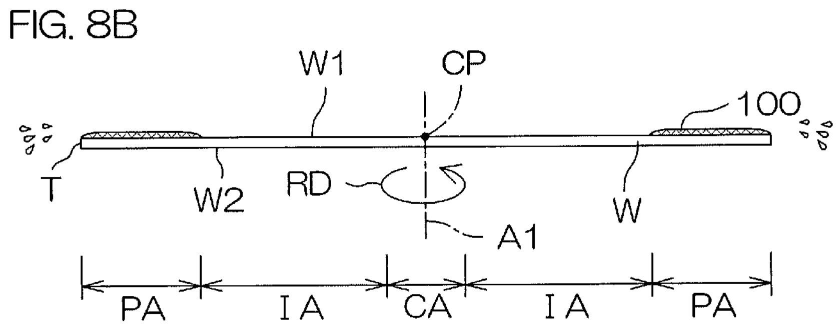
FIG. 8B is a schematic view for describing an aspect of both the substrate and its surroundings when the substrate processing according to the first modification is being performed.
Figure 8C:
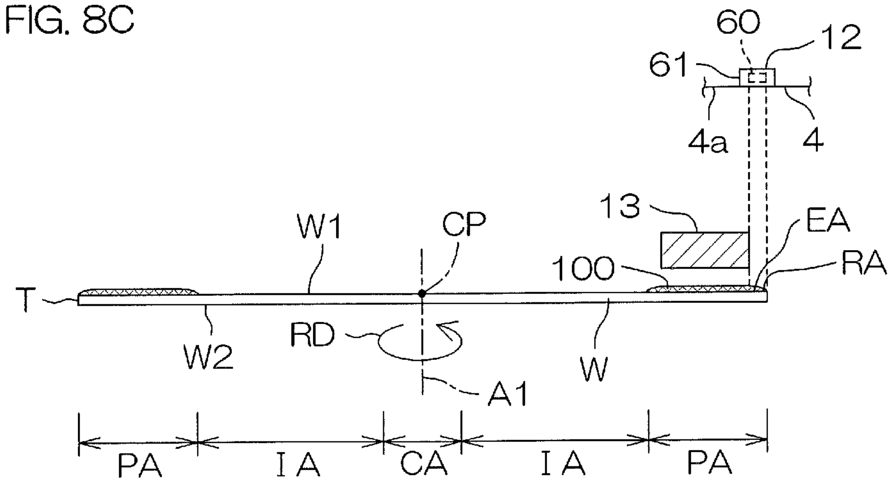
FIG. 8C is a schematic view for describing an aspect of both the substrate and its surroundings when the substrate processing according to the first modification is being performed.

FIG. 8A to FIG. 8C are schematic views for describing substrate processing according to a first modification.

Substrate processing according to the first modification shown in FIG. 8A to FIG. 8C differs from substrate processing shown in FIG. 5 in the fact that, in the substrate processing according to the first modification, the polymer film 100 is formed in a peripheral region PA without forming the polymer film 100 in an inner region IA closer to the center portion CP than the peripheral region PA in the upper surface of the substrate W. The peripheral region PA in the upper surface of the substrate W is an annular region including the peripheral edge portion of the upper surface of the substrate W and its surroundings. The inner region IA is an annular region between the central region CA and the peripheral region PA.

Substrate processing according to the first modification will be hereinafter described in detail. In the substrate processing according to the first modification, the first nozzle driving mechanism 25 moves the polymer-containing liquid nozzle 9 to the peripheral position facing the peripheral region PA of the upper surface of the substrate W as shown in FIG. 8A. The polymer-containing liquid valve 50 is opened in a state in which the polymer-containing liquid nozzle 9 is placed at the peripheral position. Thereby, a polymer-containing liquid is supplied (discharged) from the polymer-containing liquid nozzle 9 toward the peripheral region PA of the upper surface of the substrate W as shown in FIG. 8A (polymer-containing liquid supplying step, polymer-containing liquid discharging step). The polymer-containing liquid supplied to the peripheral region PA of the upper surface of the substrate W moves toward the peripheral edge T side of the substrate W.

The polymer-containing liquid valve 50 is closed, and then the rotation of the substrate W is accelerated so that the rotation speed of the substrate W reaches a predetermined spin-off speed (rotation accelerating step). The spin-off speed is, for example, 1500 rpm. The rotation of the substrate W at the spin-off speed is continued, for example, for 30 seconds. Part of the polymer-containing liquid on the substrate W is spattered outwardly from the peripheral edge portion of the substrate W, and a liquid film of the polymer-containing liquid on the substrate W is thinned (spin-off step). The polymer-containing liquid on the upper surface of the substrate W is not required to be spattered outwardly from the substrate W, and is merely required to be spread throughout the entirety of the peripheral edge portion of the upper surface of the substrate W by means of the action of the centrifugal force by the rotation of the substrate W.

A gas-flow is formed in which a gas contiguous to the polymer-containing liquid on the substrate W flows outwardly from the center portion CP side of the upper surface of the substrate W by means of the action of the centrifugal force caused by the rotation of the substrate W. Because of this gas-flow, a gaseous solvent contiguous to the polymer-containing liquid on the substrate W is excluded from an atmosphere contiguous to the substrate W. Therefore, the evaporation (volatilization) of the solvent from the polymer-containing liquid on the substrate W is facilitated, and the polymer film 100 is formed as shown in FIG. 8B (polymer film forming step). The polymer film 100 assumes a circular annular shape in a plan view.

Thereafter, the light irradiation step (Step S3) of irradiating light L onto the peripheral edge portion of the upper surface of the substrate W is performed as shown in FIG. 8C in the same way as the substrate processing shown in FIG. 5. Preferably, the polymer film 100 reaches a position closer to the center portion CP side of the substrate W than the irradiation region RA. In other words, the inner end in the radial direction of the polymer film 100 is placed closer to the center portion CP side than the inner end in the radial direction of the irradiation region RA.

The light irradiation step (Step S3) is completed, and then the processes from the polymer film removing step (Step S4) to the substrate carry-out step (Step S7) are performed.

The substrate processing according to the first modification is performed, thus making it possible to accurately control the etching width EW of the peripheral edge portion of the upper surface of the substrate W while reducing the consumption of the polymer film 100.

<Substrate Processing According to Second Modification>

Figure 9:
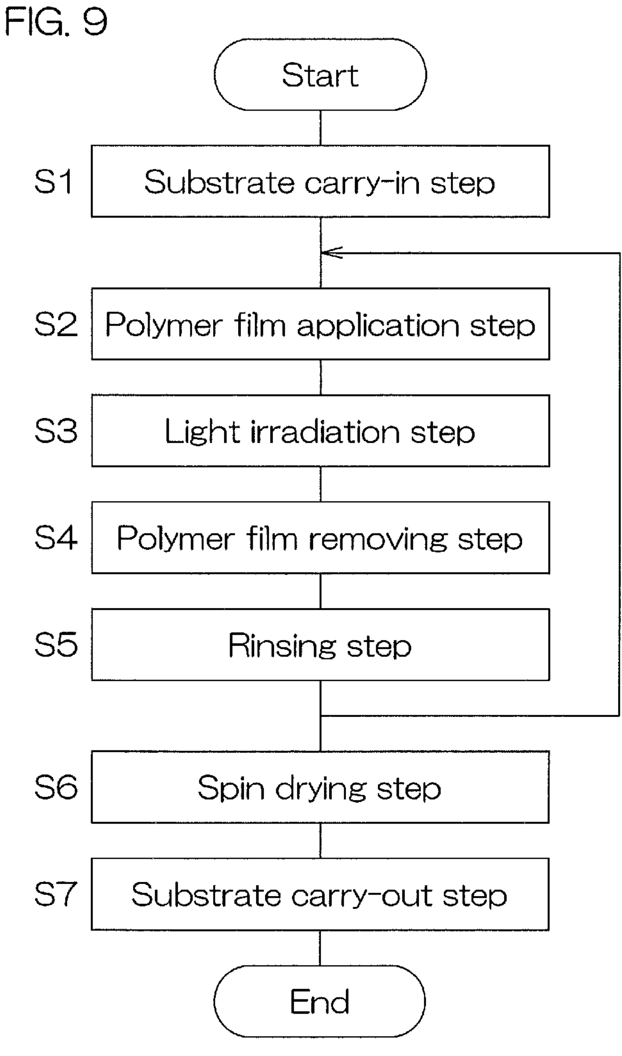
FIG. 9 is a flowchart for describing substrate processing according to a second modification.

FIG. 9 is a flowchart for describing substrate processing according to a second modification. FIG. 10A to FIG. 10E are schematic views for describing a change of the peripheral edge portion of the upper surface of the substrate W during the substrate processing according to the second modification.

The substrate processing according to the second modification shown in FIG. 9 to FIG. 10E differs from the substrate processing shown in FIG. 5 in the fact that, in the substrate processing according to the second modification, the processes from the polymer film forming step (Step S2) to the rinsing step (Step S5) are performed a plurality of times. The act of performing the processes from the polymer film forming step (Step S2) to the rinsing step (Step S5) a plurality of times is referred to as cycle etching. In cycle etching, the polymer film forming step and the light irradiation step are alternately performed a plurality of times.

An example in which cycle etching is performed three times will be hereinafter described. An initial light irradiation step is referred to as a first light irradiation step, and a light irradiation step performed subsequent to the first light irradiation step is referred to as a second light irradiation step. The last light irradiation step is referred to as a third light irradiation step.

Figure 10A:
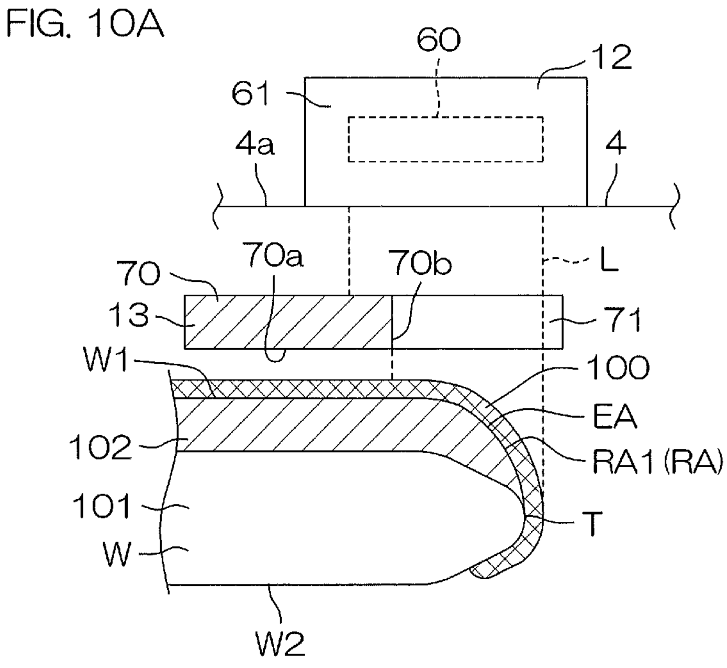
FIG. 10A is a schematic view for describing a change in a peripheral edge portion of a substrate while the substrate processing according to the second modification is being performed.

FIG. 10A shows a state of the peripheral edge portion of the upper surface of the substrate W when the first light irradiation step (Step S3) is performed. The position of the reflection suppression member 13 in the first light irradiation step is referred to as a first adjoining position. The first adjoining position may be the intercept position, or may be a position at which light L emitted from the light emission member 12 is not intercepted. The light L emitted from the light emission member 12 is irradiated onto the peripheral edge portion of the upper surface of the substrate W. In the first light irradiation step, a region on the substrate W onto which light L is irradiated is referred to as a first irradiation region RA1.

Figure 10B:
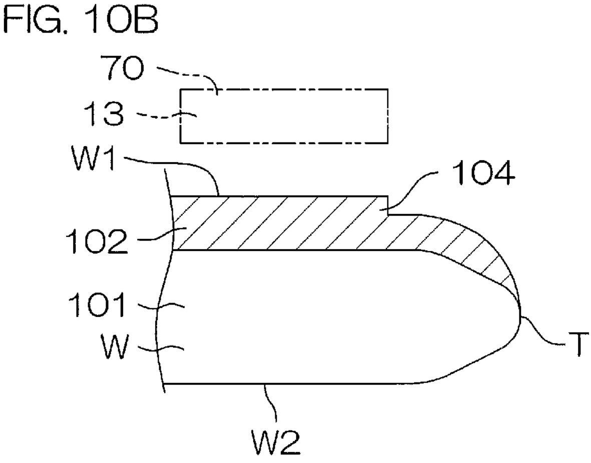
FIG. 10B is a schematic view for describing a change in the peripheral edge portion of the substrate while the substrate processing according to the second modification is being performed.

The first light irradiation step (Step S3) is completed, and then the polymer film removing step (Step S4) is performed, and, as a result, a part, which has been etched in the first light irradiation step, of the to-be-processed film 102 is removed as shown in FIG. 10B. Therefore, a level difference 104 is formed in the to-be-processed film 102 so that the to-be-processed film 102 becomes thinner toward the peripheral edge T (front end) of the substrate W.

The rinsing step (Step S5) and the polymer film forming step (Step S2) are performed, and then the second light irradiation step (Step S3) is performed.

FIG. 10C shows a state of the peripheral edge portion of the upper surface of the substrate W when the second light irradiation step (Step S3) is performed. The position of the reflection suppression member 13 in the second light irradiation step is referred to as a second adjoining position.

The second adjoining position is the intercept position. The second adjoining position is a more outward position in the radial direction than the first adjoining position. In other words, the second adjoining position is a position closer to the peripheral edge T than the first adjoining position. Part of the light L emitted from the light emission member 12 is intercepted by the reflection suppression member 13. In the second light irradiation step, a region on the substrate W onto which the light L is irradiated is referred to as a second irradiation region RA2.

The inner end in the radial direction of the first irradiation region RA1 is placed closer to the center portion CP side (inside in the radial direction) of the upper surface of the substrate W than the inner end in the radial direction of the second irradiation region RA2. In other words, the first irradiation region RA1 reaches a more inward position in the radial direction than the second irradiation region RA2.

As described, the irradiation region adjusting step of moving the reflection suppression member 13 and adjusting the size of the irradiation region RA is performed in the substrate processing according to the second modification. In detail, the reflection suppression member 13 is moved so that the first irradiation region RA1 reaches a more inward position in the radial direction than the second irradiation region RA2. In more detail, the first light irradiation step is completed, and then the reflection suppression member 13 placed at the first adjoining position is moved to the retreat position, and is moved to the second adjoining position in the second light irradiation step.

The second light irradiation step (Step S3) is completed, and then the polymer film removing step (Step S4) is performed, and, as a result, a part, which has been etched in the second light irradiation step, of the to-be-processed film 102 is removed as shown in FIG. 10D. The first irradiation region RA1 has reached a more inward position in the radial direction than the second irradiation region RA2, and therefore a part of the region, which has been etched by the first light irradiation step, of the peripheral edge portion of the upper surface of the substrate W is not removed. Therefore, another level difference 104 is formed in the to-be-processed film 102 so that the to-be-processed film 102 becomes thinner toward the peripheral edge T (front end) of the substrate W.

Furthermore, thereafter, the polymer film forming step (Step S2), the third light irradiation step (Step S3), and the polymer film removing step (Step S4) are performed, and, as a result, the to-be-processed film 102 having a predetermined distance from the peripheral edge T (front end) of the substrate W is removed. Thereby, still another level difference 104 formed, is and the semiconductor layer 101 is exposed, and the exposed region EX is formed. The plurality of level differences 104 are placed at an outer peripheral edge of the to-be-processed film 102.

As thus described, the substrate processing according to the second modification is performed, and, as a result, the plurality of level differences 104 are formed at the outer peripheral edge of the to-be-processed film 102 so that the to-be-processed film 102 becomes thinner toward the peripheral edge T of the substrate W. As a result, it is possible to suppress the to-be-processed film 102 from being unintendedly peeled off after the substrate processing is completed.

Although an example in which cycle etching is performed three times has been described as shown in FIG. 10A to FIG. 10E, the cycle etching may be performed four or more times or may be performed two times. In any case, the to-be-processed film 102 becomes thinner toward the peripheral edge T of the substrate W, and the plurality of level differences 104 are formed in the to-be-processed film 102 so that the semiconductor layer 101 is exposed. Therefore, it is possible to suppress the to-be-processed film 102 from being unintendedly peeled off.

<Modification of Processing Unit>

Next, the processing unit 2 according to the first modification to third modification will be described with reference to FIG. 11 to FIG. 14.

Figure 11:
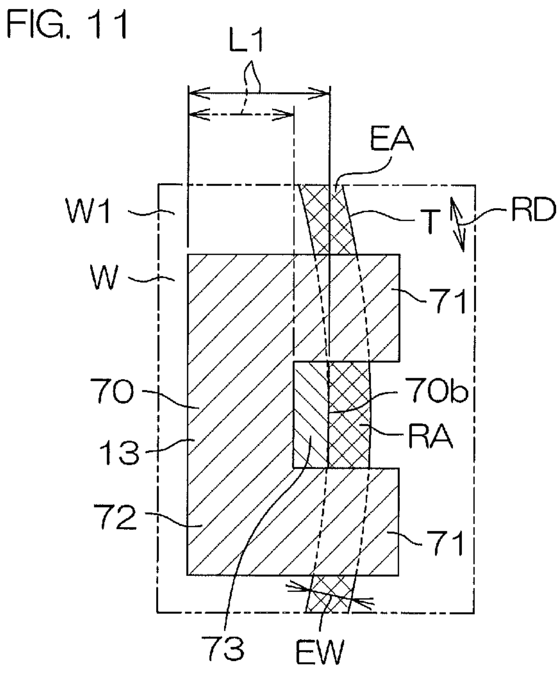
FIG. 11 is a schematic view for describing a reflection suppression member included in a processing unit according to the first modification.

FIG. 11 is a schematic view for describing the reflection suppression member 13 included in the processing unit 2 according to the first modification.

The reflection suppression member 13 according to the first modification is configured to be capable of adjusting the width L1 of the first portion 70. The first portion 70 includes a main body portion 72 and an adjusting portion 73 fixed to a position contiguous to the main body portion 72 between the pair of second portions 71. Therefore, it is possible to accurately adjust the size of the irradiation region RA even if the reflection suppression member driving mechanism 31 (see FIG. 2) is not provided or even if the accuracy of movement in the direction (horizontal direction) along the upper surface of the substrate W by the reflection suppression member driving mechanism 31 is insufficient.

Figure 12:
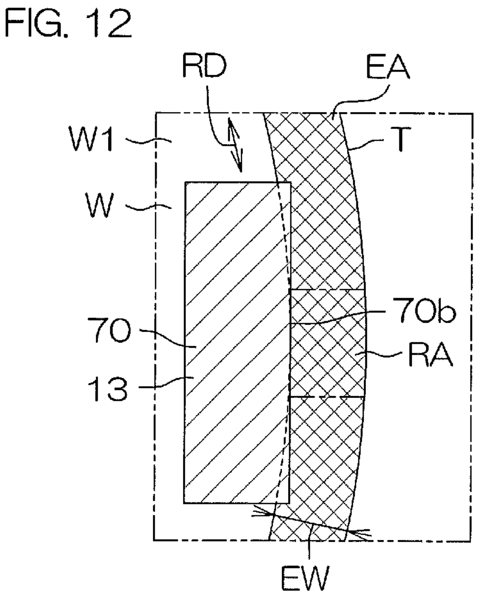
FIG. 12 is a schematic view for describing a reflection suppression member included in a processing unit according to the second modification.

FIG. 12 is a schematic view for describing the reflection suppression member 13 included in the processing unit 2 according to the second modification. The reflection suppression member 13 according to the second modification is not provided with the pair of second portions 71, and includes the first portion 70 having a quadrangular shape in a plan view. If the reflection suppression member 13 has the first portion 70 that can be disposed at the adjoining position, it is possible to suppress light L reflected from the irradiation region RA from being irradiated onto a position closer to the center portion CP of the upper surface of the substrate W than the reflection suppression member 13. In other words, the pair of second portions 71 are not necessarily required. Unlike FIG. 3A and FIG. 12, a configuration can be employed in which only one of the pair of second portions 71 is provided, and adjoins the irradiation region RA from one side in the rotation direction RD of the single second portion 71.

Figure 13:
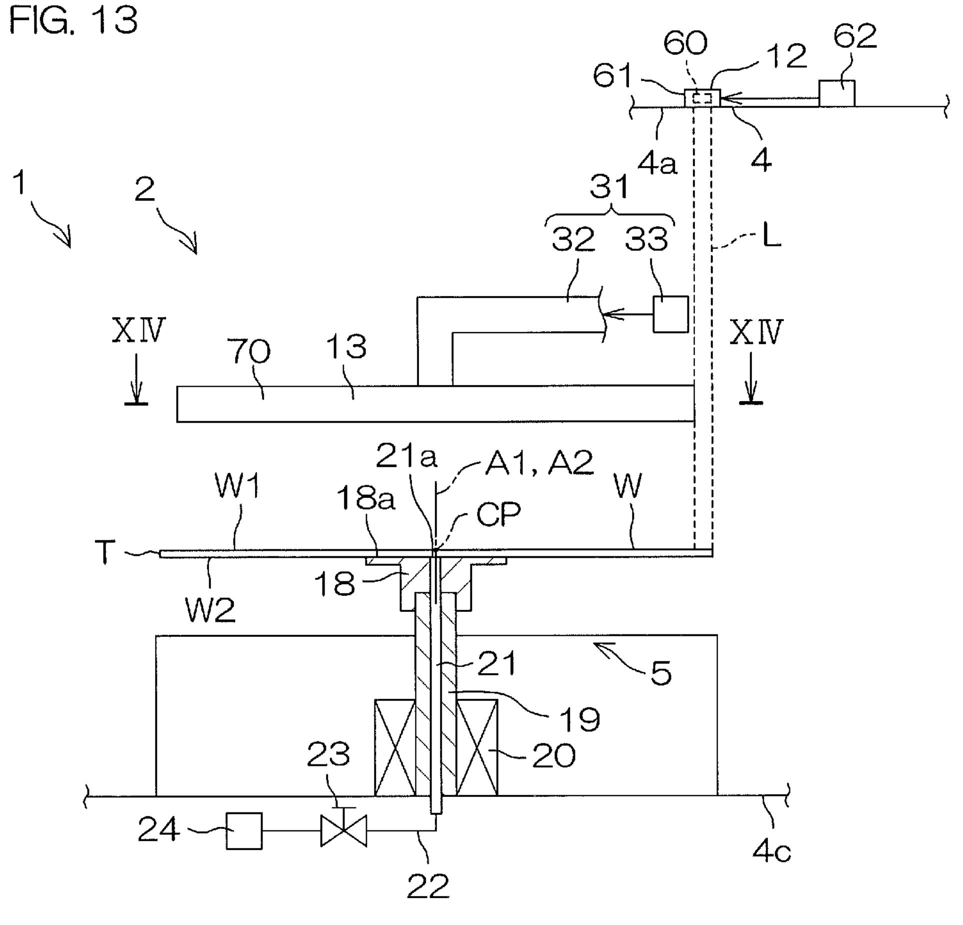
FIG. 13 is a schematic view for describing a reflection suppression member included in a processing unit according to a third modification.
Figure 14:
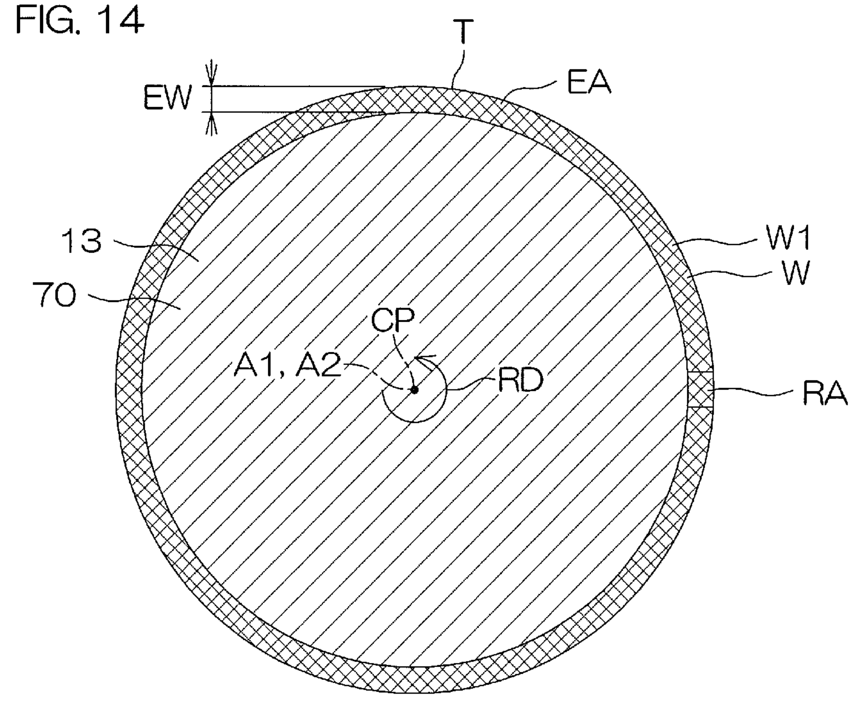
FIG. 14 is a cross-sectional view along line XIV-XIV shown in FIG. 13.

FIG. 13 is a schematic view for describing the reflection suppression member 13 included in the processing unit 2 according to the third modification. FIG. 14 is a cross-sectional view along line XIV-XIV shown in FIG. 13. The reflection suppression member 13 according to the third modification is not provided with the pair of second portions 71 in the same way as the reflection suppression member 13 according to the second modification. Additionally, the reflection suppression member 13 according to the third modification includes the first portion 70 having a circular shape in a plan view. In detail, the reflection suppression member 13 has a center axis A2, and the center axis A2 is placed on the rotational axis A1 when the first portion 70 is placed at the adjoining position.

Therefore, if the first portion 70 is placed at the adjoining position, the first portion 70 is enabled to always suppress the light L from being irradiated onto a position closer to the center portion CP of the upper surface of the substrate W than the first portion 70 in the whole area in the rotation direction RD. Therefore, it is possible to highly reliably suppress the light L reflected from the irradiation region RA from being irradiated onto a position closer to the center portion CP of the upper surface of the substrate W than the irradiation region RA in the entire periphery of the upper surface of the substrate W.

Unlike the third modification, the first portion 70 may have a circular annular shape in a plan view. Additionally, the first portion 70 may assume a circular annular shape or a circular shape in a plan view, and the second portion 71 that adjoins the irradiation region RA from at least one side of the rotation direction RD may be provided. For example, the reflection suppression member 13 may be configured to be able to face the entirety of the upper surface of the substrate W except the irradiation region RA.

<Configuration of Substrate Processing Apparatus According to Second Preferred Embodiment>

Figure 15:
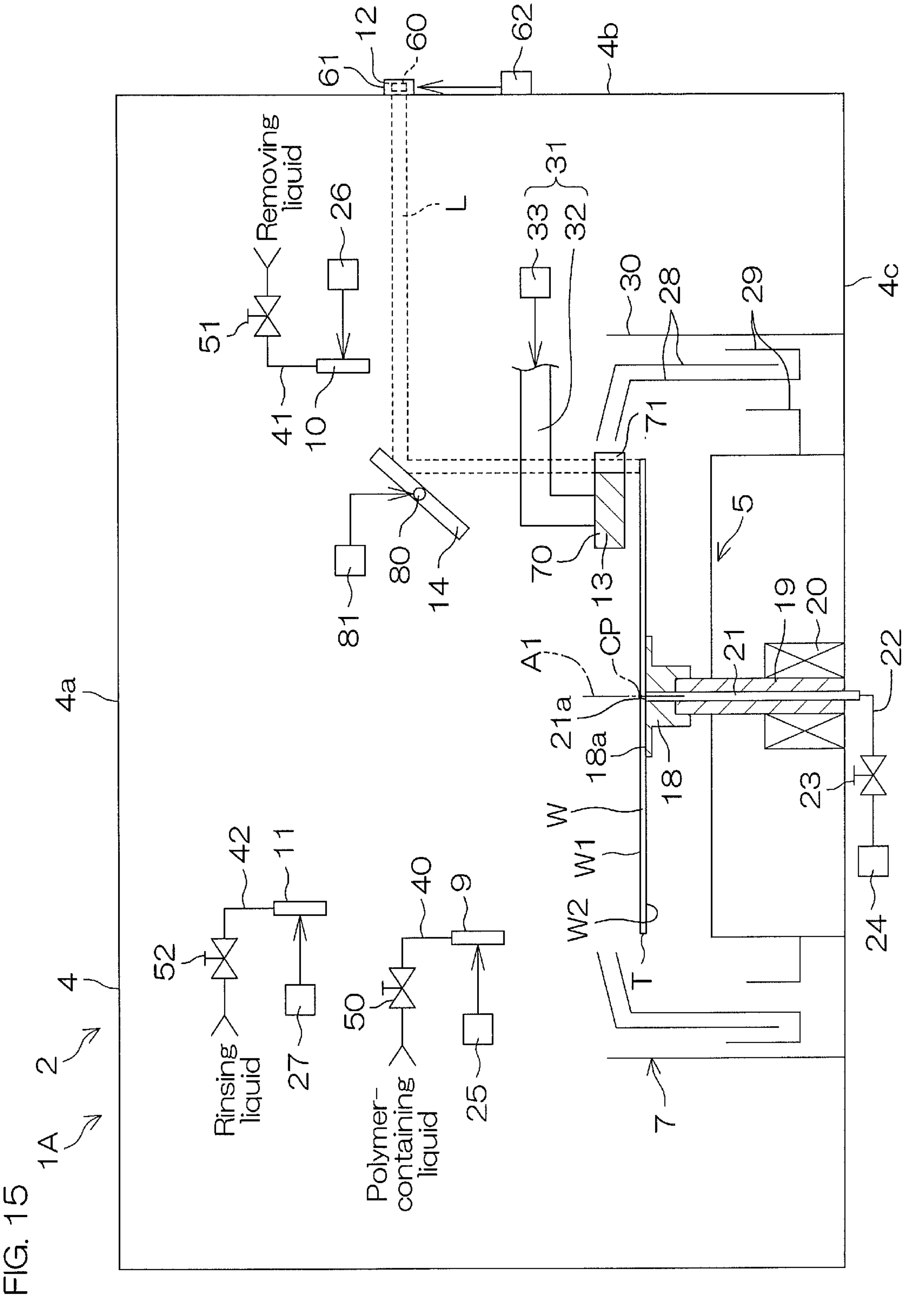
FIG. 15 is a schematic view for describing a configuration of a processing unit included in a substrate processing apparatus according to a second preferred embodiment.

FIG. 15 is a schematic view for describing configuration of a processing unit 2 included in a substrate processing apparatus 1A according to the second preferred embodiment. In FIG. 15, the same reference sign as in FIG. 1 or in other drawings is assigned to a constituent equivalent to each constituent shown in FIG. 1 to FIG. 14 mentioned above, and a description of this constituent is omitted. The same applies to FIG. 16A and FIG. 16B described later.

The substrate processing apparatus 1A according to the second preferred embodiment differs from the substrate processing apparatus 1 according to the first preferred embodiment chiefly in the fact that the processing unit 2 additionally includes a direction changing member 14 that changes the traveling direction of light L so as to approach an orthogonal direction (for example, vertical direction) with respect to the first principal surface of the substrate W.

The light emission member 12 included in the processing unit 2 according to the second preferred embodiment is supported by the sidewall 4*b* of the chamber 4. The housing 61 is attached to the sidewall 4*b* from the outside of the chamber 4. Therefore, light L emitted from the light emission member 12 travels in a direction that intersects the vertical direction. Light emitted from the light source 60 passes through the sidewall 4*b* of the chamber 4 and through the housing 61, and its traveling direction is changed by the direction changing member 14, and is irradiated onto the peripheral edge portion of the upper surface of the substrate W held by the spin chuck 5 in the chamber 4. Part, through which light L passes, of both the sidewall 4*b* of the chamber 4 and the housing 61 is made of a transmissive member, such as quartz, that has optical transparency.

The direction changing member 14 includes, for example, a reflection mirror that reflects light L. In relation to the direction changing member 14, the processing unit 2 includes a rotation support shaft 80 that rotatably supports the direction changing member 14 and a rotation-support-shaft driving mechanism 81 that rotates the direction changing member 14 through the rotation support shaft 80. The rotation-support-shaft driving mechanism 81 includes an actuator such as an electric motor or an air cylinder. The rotation support shaft 80 is fixed to the chamber 4 in a rotatable state. The rotation support shaft 80 may be fixed to the sidewall 4*b*, or may be fixed to the upper wall 4*a*.

The use of the substrate processing apparatus 1A according to the second preferred embodiment makes it possible to perform the same substrate processing (for example, substrate processing shown in FIG. 5 and substrate processing shown in FIG. 9) as the substrate processing according to the first preferred embodiment. As a matter of course, substrate processing shown in FIG. 8A to FIG. 8C is also feasible.

Figure 16A:
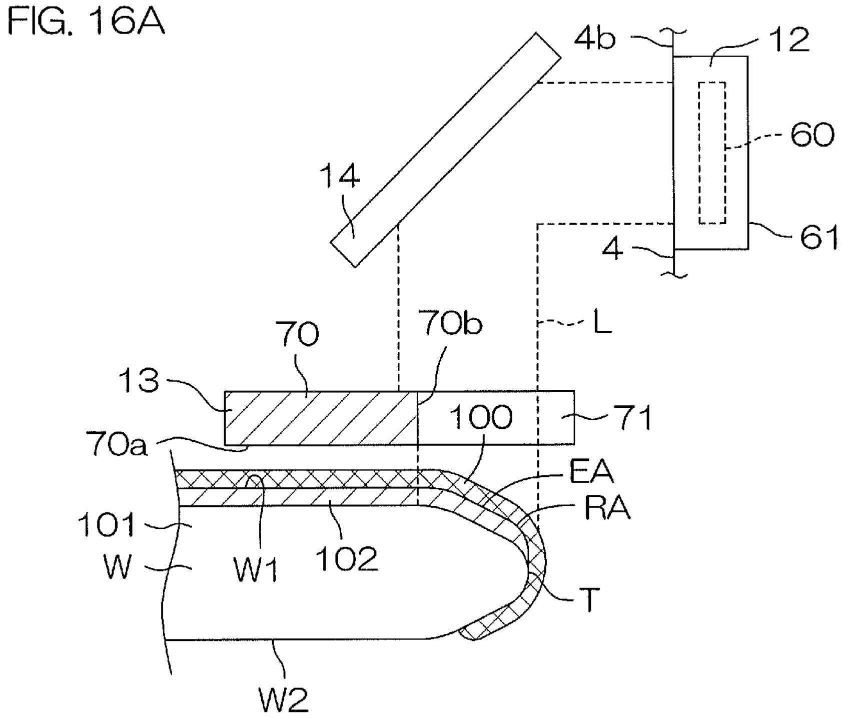
FIG. 16A is a schematic view for describing an aspect of both a peripheral edge portion of a substrate and its surroundings when substrate processing is being performed by a substrate processing apparatus according to the second preferred embodiment.
Figure 16B:
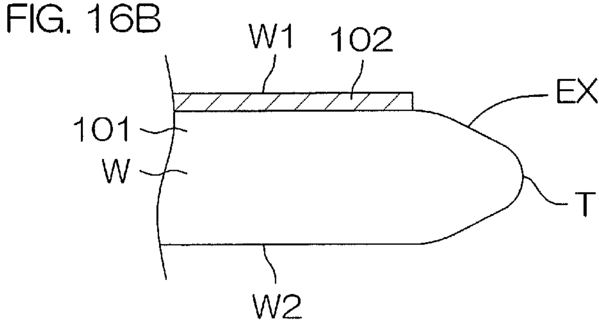
FIG. 16B is a schematic view for describing an aspect of both the peripheral edge portion of the substrate and its surroundings when the substrate processing is being performed by the substrate processing apparatus according to the second preferred embodiment.

FIG. 16A and FIG. 16B are schematic views for describing an aspect of both the peripheral edge portion of the substrate W and its surroundings when substrate processing is performed by the substrate processing apparatus 1A according to the second preferred embodiment.

In the light irradiation step (Step S2) of substrate processing performed by the substrate processing apparatus 1A according to the second preferred embodiment, the traveling direction of light L emitted from the light emission member 12 is changed by the direction changing member 14 as shown in FIG. 16A. Light L whose traveling direction has been changed by the direction changing member 14 is irradiated onto the peripheral edge portion of the upper surface of the substrate W (irradiating step). The to-be-processed film 102 is removed from a region (etching region EA), onto which light L has been irradiated, of the upper surface of the substrate W as shown in FIG. 16B.

According to the second preferred embodiment, it is possible to allow the traveling direction of light L to approach a direction (for example, vertical direction) orthogonal to the upper surface of the substrate W even if the traveling direction of light L emitted from the light emission member 12 is a direction (for example, horizontal direction) along the upper surface of the substrate W. Therefore, it is possible to improve the degree of freedom of the disposition of the light emission member 12. Additionally, the support shaft 80 is rotated, thus making it possible to adjust the position of the irradiation region RA on the substrate W.

<Configuration of Processing Unit According to Modification of Second Preferred Embodiment>

Next, the processing unit 2 according to first modification to fourth modification of the second preferred embodiment will be described with reference to FIG. 17A to FIG. 22.

Figure 17A:
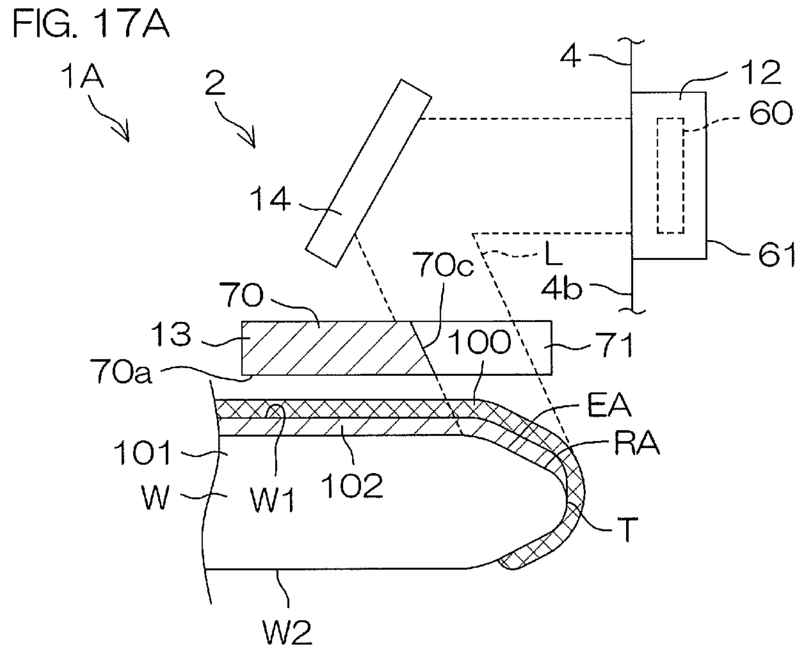
FIG. 17A is a schematic view for describing a configuration of a processing unit according to a first modification of the second preferred embodiment.
Figure 17B:
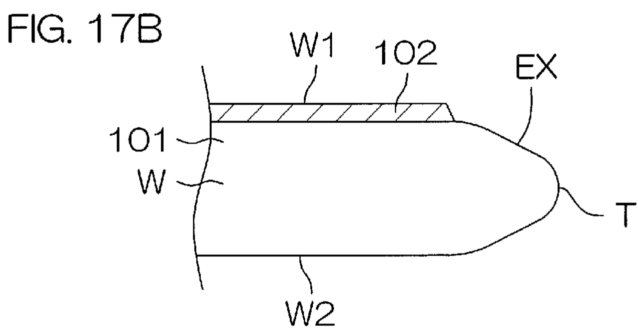
FIG. 17B is a schematic view for describing a configuration of the processing unit according to the first modification of the second preferred embodiment.

FIG. 17A and FIG. 17B are schematic views for describing a configuration of the processing unit 2 according to the first modification of the second preferred embodiment.

The first portion 70 of the reflection suppression member 13 according to the first modification of the second preferred embodiment has the facing surface 70*a* and an inclined surface 70*c* that is connected to the facing surface 70*a* so as to make an acute angle with the facing surface 70*a* inside the first portion 70 and that is inclined with respect to the facing surface 70*a* as shown in FIG. 17A.

According to the first modification of the second preferred embodiment, it is possible to suppress light L emitted from the light emission member 12 from being irradiated onto a position closer to the center portion CP than the inclined surface 70*c*. Additionally, light L is emitted from the light emission member 12 along the inclined surface 70*c* as shown in FIG. 17A, thus making it possible to obliquely etch the to-be-processed film 102 on the upper surface of the substrate W. Thereby, an outer end in the radial direction of the to-be-processed film 102 of the peripheral edge portion of the upper surface of the substrate W is enabled to assume a tapered sectional shape as shown in FIG. 17B. As a result, it is possible to suppress the to-be-processed film 102 from being peeled off after the substrate processing is completed.

Figure 18:
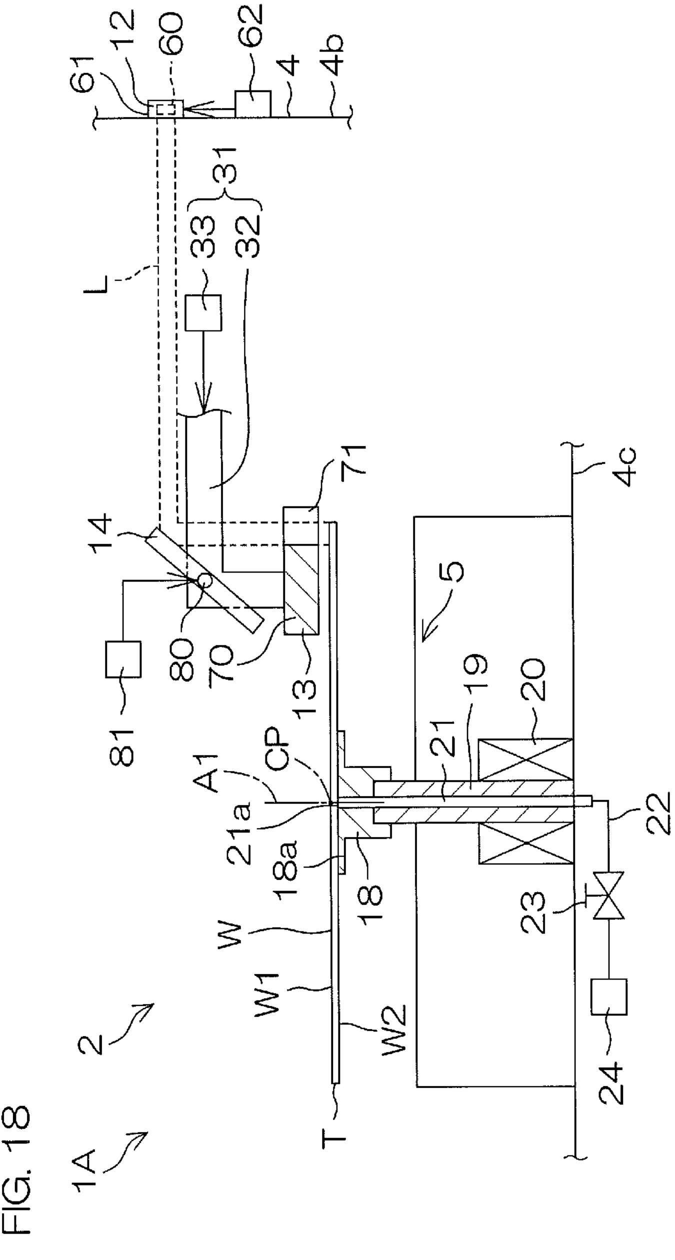
FIG. 18 is a schematic view for describing a configuration of a processing unit according to a second modification of the second preferred embodiment.

FIG. 18 is a schematic view for describing a configuration of the processing unit 2 according to the second modification of the second preferred embodiment. The direction changing member 14 according to the second modification of the second preferred embodiment may be supported by the arm 32 as shown in FIG. 18. Therefore, the direction changing member 14 is enabled to move toward the substrate W together with the reflection suppression member 13.

Figure 19:
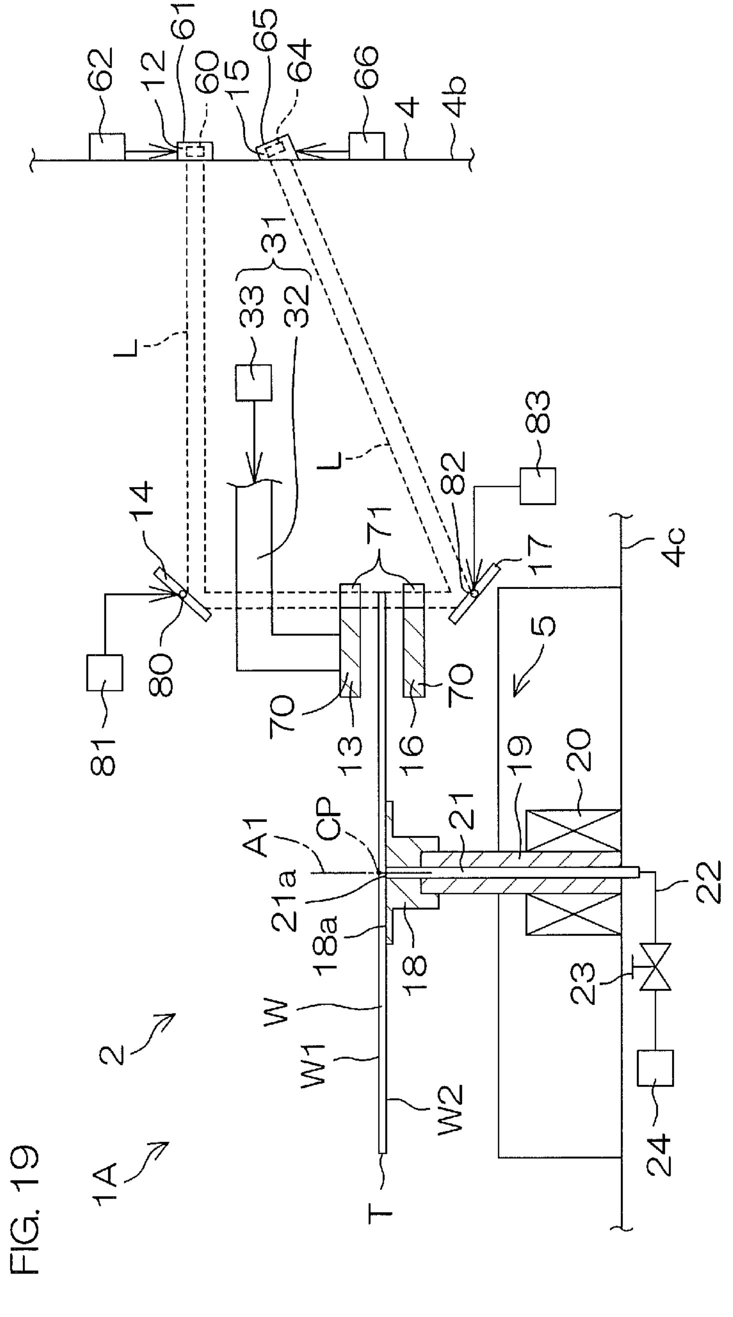
FIG. 19 is a schematic view for describing a configuration of a processing unit according to a third modification of the second preferred embodiment.

FIG. 19 is a schematic view for describing a configuration of the processing unit 2 according to the third modification of the second preferred embodiment. The processing unit 2 according to the third modification of the second preferred embodiment includes a lower light emission member 15, a lower reflection suppression member 16, and a lower direction changing member 17 as shown in FIG. 19.

The lower light emission member 15 emits light L and irradiates light L onto the peripheral edge portion of the lower surface of the substrate W. The lower direction changing member 17 changes the traveling direction of the light L emitted from the lower light emission member 15, and changes the traveling direction of the light L so as to approach an orthogonal direction (for example, vertical direction) to the first principal surface of the substrate W. The lower reflection suppression member 16 faces the lower surface of the substrate W, and suppresses the light L from being reflected from the lower reflection suppression member 16.

The lower light emission member 15 includes, for example, a lower light source 64 that emits light L and a lower housing 65 that houses the lower light source 64. The lower light emission member 15 is supported by, for example, the sidewall 4*b* of the chamber 4. The lower light emission member 15 is disposed outside the chamber 4. The lower housing 65 is attached to the sidewall 4*b* from the outside of the chamber 4.

A light source having the same configuration as the light source 60 can be employed as the lower light source 64. Therefore, a detailed description of the lower light source 64 is omitted. Light emitted from the lower light source 64 passes through the sidewall 4*b* of the chamber 4 and through the lower housing 65, and is finally irradiated onto the peripheral edge portion of the upper surface of the substrate W held by the spin chuck 5 in the chamber 4. Part, through which light L passes, of both the sidewall 4*b* of the chamber 4 and the lower housing 65 is made of a transmissive member, such as quartz, that has optical transparency.

A lower energizing unit 66, such as a power source, is connected to the lower light emission member 15, and electric power is supplied from the lower energizing unit 66 to the lower light emission member 15, and, as a result, light L is emitted from the lower light emission member 15.

The lower direction changing member 17 includes, for example, a reflection mirror that reflects light L. In relation to the lower direction changing member 17, the processing unit 2 includes a lower rotation support shaft 82 that rotatably supports the lower direction changing member 17 and a lower rotation-support-shaft driving mechanism 83 that rotates the lower direction changing member 17 through the lower rotation support shaft 82. The lower rotation-support-shaft driving mechanism 83 includes an actuator such as an electric motor or an air cylinder.

The lower reflection suppression member 16 can employ a reflection suppression member having the same configuration as the reflection suppression member 13. Therefore, a detailed description of the lower reflection suppression member 16 is omitted. The lower reflection suppression member 16 is disposed in the chamber 4, and may be fixed to, for example, a position that faces the lower surface of the substrate W.

According to the third modification of the second preferred embodiment, light L is irradiated onto both the peripheral edge portion of the upper surface of the substrate W and the peripheral edge portion of the lower surface of the substrate W. For example, if the to-be-processed film 102 extends to the peripheral edge portion of the lower surface of the substrate W, light L is required to be irradiated onto the peripheral edge portions of both surfaces (upper surface and lower surface) of the substrate W. If the configuration of the third modification of the second preferred embodiment is employed in such a case, it is possible to reduce the number of members necessary to irradiate light L.

Figure 20:
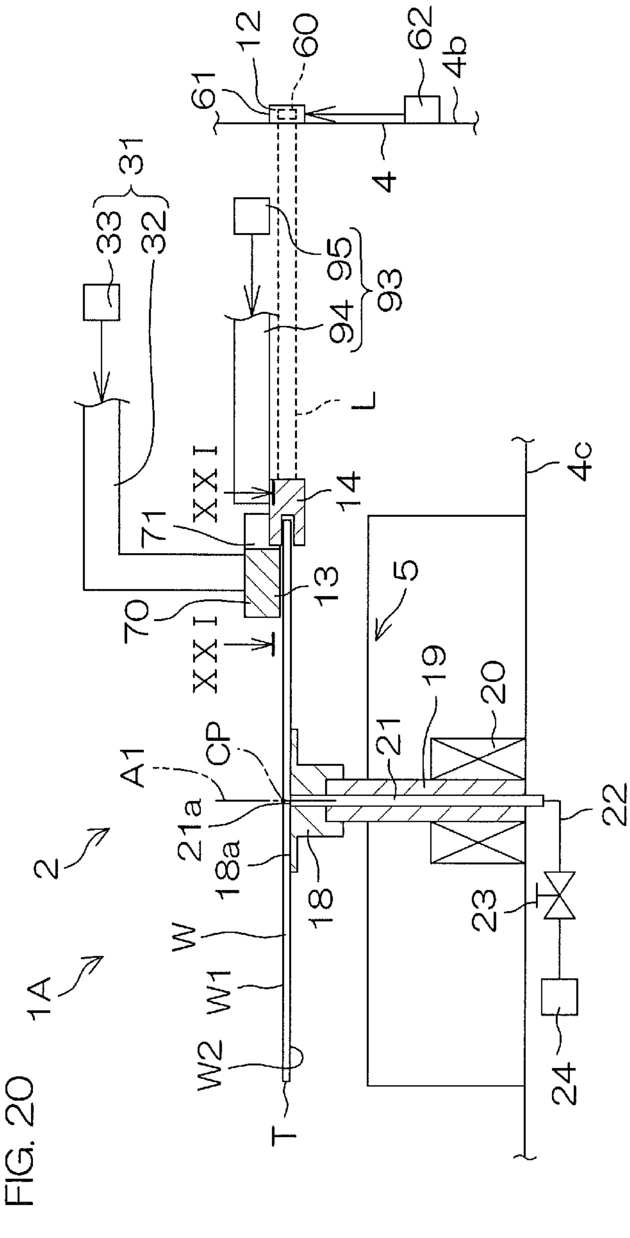
FIG. 20 is a schematic view for describing a configuration of a processing unit according to a fourth modification of the second preferred embodiment.
Figure 21:
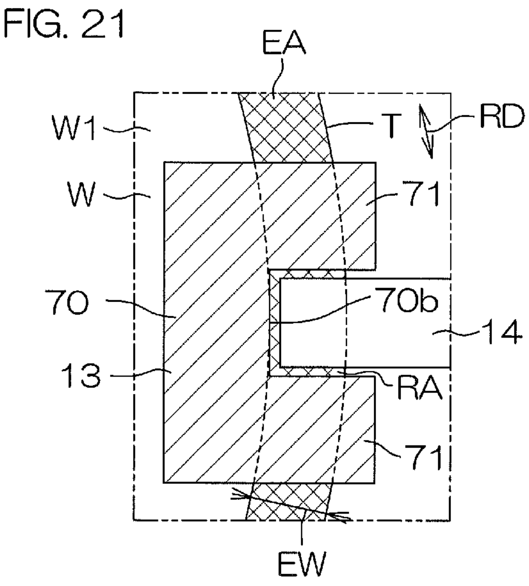
FIG. 21 is a cross-sectional view along line XXI-XXI shown in FIG. 20.
Figure 22:
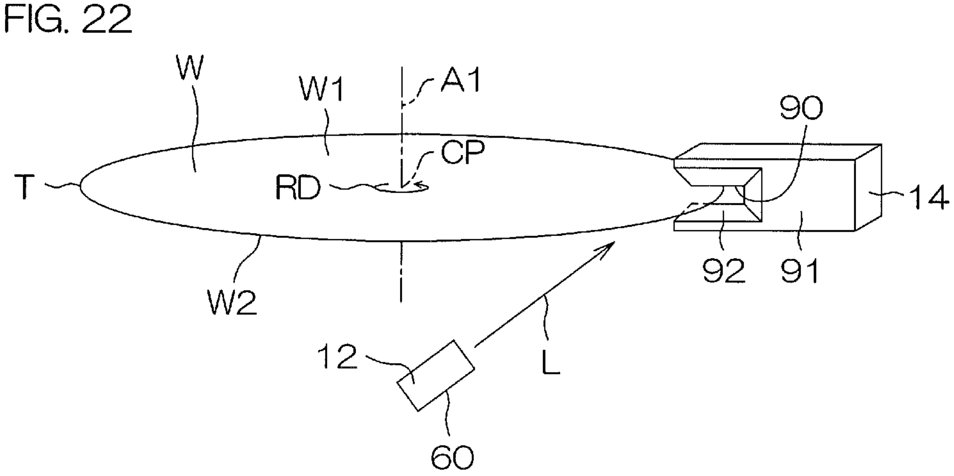
FIG. 22 is a perspective view of a direction changing member included in the processing unit according to the fourth modification of the second preferred embodiment.

FIG. 20 is a schematic view for describing a configuration of the processing unit 2 according to the fourth modification of the second preferred embodiment. FIG. 21 is a cross-sectional view along line XXI-XXI. FIG. 22 is a perspective view of the direction changing member 14 included in the processing unit 2 according to the fourth modification of the second preferred embodiment.

The direction changing member 14 included in the processing unit 2 according to the fourth modification includes a support portion 91 having a recess portion 90 that can house the peripheral edge portion of the substrate W and a reflecting portion 92 that is provided at an edge portion of the recess portion 90 and that reflects light.

The reflecting portion 92 faces both the upper surface and the lower surface of the substrate W in a state in which the peripheral edge portion of the substrate W is housed in the recess portion 90. Light L emitted from the light emission member 12 is irradiated onto both the upper surface and the lower surface of the substrate W by allowing the reflecting portion 92 to reflect light L emitted from the light emission member 12. The reflecting portion 92 of the direction changing member 14 is configured to reflect light L received from the light source 60 toward the upper surface and the lower surface of the substrate W by appropriately designing a relative arrangement between the light source 60 (light emission member 12) and the direction changing member 14. In detail, a relative arrangement between the light source 60 and the direction changing member 14 may be designed so that light L is made incident on a reflecting surface forming the reflecting portion 92 from the horizontal direction that intersects the radial direction in which the rotational axis A1 and the direction changing member 14 face each other as shown in FIG. 22.

The direction changing member 14 may be a prism made of a light transmission member such as quartz. In this case, light from the light source 60 attached to the sidewall 4*b* of the chamber 4 may be made incident on an incidence surface (end surface that faces the light source 60) of the direction changing member 14, and be then subjected to internal reflection or subjected to refraction at the reflecting portion 92, and then may be made incident on the upper and lower surfaces of the substrate W.

The direction changing member 14 is moved in the direction (horizontal direction) along the upper surface of the substrate W by means of a direction-changing-member driving mechanism 93. The direction-changing-member driving mechanism 93 is capable of moving the direction changing member 14 between a housing position (position shown in FIG. 22) and a retreat position. The housing position is a position at which the peripheral edge portion of the substrate W is housed in the recess portion 90 of the support portion 91. The retreat position is a position at which the peripheral edge portion of the substrate W recedes from the recess portion 90. The direction changing member 14 is placed between the pair of second portions 71 when the direction changing member 14 is placed at the housing position (see FIG. 21).

The direction-changing-member driving mechanism 93 includes an arm 94 that supports the direction changing member 14 and an arm driving mechanism 95 that moves the direction changing member 14 in a direction (horizontal direction) along the upper surface of the substrate W. The arm driving mechanism 95 includes an actuator such as an electric motor or an air cylinder.

The direction changing member 14 may be a turnable direction changing member that turns around a predetermined turning axis, or may be a linearly-movable direction changing member that linearly moves in a direction in which a corresponding arm extends. The direction changing member 14 may be configured to be able to also move in the vertical direction.

According to the fourth modification of the second preferred embodiment, light L is irradiated onto both the peripheral edge portion of the upper surface of the substrate W and the peripheral edge portion of the lower surface of the substrate W. Therefore, it is possible to remove the to-be-processed film 102 from both the peripheral edge portion of the upper surface of the substrate W and the peripheral edge portion of the lower surface of the substrate W. Additionally, it is possible to irradiate light L onto the peripheral edge portions of both surfaces of the substrate W by use of the single light source 60 and the single direction changing member 14. Therefore, if there is a need to irradiate light L onto the peripheral edge portions of both surfaces of the substrate W, it is possible to reduce the number of members necessary to irradiate light L by employing the configuration of the fourth modification of the second preferred embodiment.

OTHER PREFERRED EMBODIMENTS

The present invention is not limited to the preferred embodiments described above, and can further be implemented in other modes.

(1) In each of the preferred embodiments mentioned above, a configuration is employed in which the plurality of processing liquids are discharged from the plurality of processing liquid nozzles. However, the aspect of the discharge of the processing liquid is not limited to each of the aforementioned preferred embodiments. For example, unlike the aforementioned preferred embodiments, the processing liquid may be configured to be discharged from a stationary nozzle whose position in the chamber 4 is fixed, or all processing liquids may be configured to be discharged from a single nozzle.

(2) In each of the aforementioned preferred embodiments, the polymer film 100 is formed by supplying a continuous flow of the polymer-containing liquid to the upper surface of the substrate W and by spreading the polymer-containing liquid by means of the centrifugal force. The method for supplying the polymer-containing liquid is not limited to the method shown in FIG. 6A and FIG. 6B. For example, the continuous flow of the polymer-containing liquid may be supplied to the upper surface of the substrate W without changing the rotation speed of the substrate W. Additionally, the polymer-containing liquid nozzle 9 may be moved in the direction along the upper surface of the substrate W while supplying the polymer-containing liquid to the upper surface of the substrate W.

Additionally, unlike the aforementioned preferred embodiments, the polymer film 100 may be formed on the upper surface of the substrate W by applying the polymer-containing liquid onto the upper surface of the substrate W. In detail, the polymer film 100 may be formed by moving a bar-shaped application member having a surface to which the polymer-containing liquid has adhered along the upper surface of the substrate W while allowing the bar-shaped application member to come into contact with the upper surface of the substrate W.

(3) In each of the aforementioned preferred embodiments, light L emitted from the light emission member 12 is irradiated onto a predetermined range in the rotation direction RD in the peripheral edge portion of the upper surface of the substrate W. However, light L emitted from the light emission member 12 may be irradiated onto the entirety of the upper surface of the substrate W at a time. In that case, preferably, the reflection suppression member 13 including the circular first portion 70 shown in FIG. 13 and FIG. 14 is used in order to accurately control the etching width EW.

(4) In each of the aforementioned preferred embodiments, a configuration has been described in which the polymer film 100 is formed on the upper surface of the substrate W and in which light L is irradiated onto the peripheral edge portion of the upper surface of the substrate W. However, the polymer film 100 may be formed on the lower surface of the substrate W, and light may be irradiated onto the peripheral edge portion of the lower surface of the substrate W. In that case, the lower surface of the substrate W corresponds to the first principal surface W1, and the upper surface of the substrate W corresponds to the second principal surface W2.

(5) In each of the aforementioned preferred embodiments, the rinsing step (Step S5) is performed subsequent to the polymer film removing step (Step S4). However, if a rinsing liquid is used as a removing liquid, the same kind of liquid will be supplied to the upper surface of the substrate W in the rinsing step. Therefore, the rinsing step can be excluded.

(6) A shutter (not shown) that shuts out light L emitted from the light source 60 and a shutter opening-closing mechanism (not shown) that opens and closes the shutter may be provided. The shutter is moved between a closed position (shut-out position) at which light L emitted from the light source 60 is shut out and an open position (irradiation position) at which light L emitted from the light source 60 is irradiated. The same applies to the lower light source 64.

(7) The light emission member 12 may be disposed in the chamber 4 as shown by an alternate long and two short dashed line in FIG. 2. Additionally, the light source 60 may be disposed outside the chamber 4, and a front end of an optical fiber (not shown) through which light L emitted from the light source 60 is transmitted may be disposed within the chamber 4. In the second preferred embodiment, the light source 60 can be likewise disposed within the chamber 4, and the optical fiber can be likewise used (not shown). The same applies to the lower light emission member 15.

(8) In the light emission member 12, its position with respect to the upper wall 4*a* or the sidewall 4*b* of the chamber 4 is not required to be fixed, and the light emission member 12 may be configured to be movable with respect to the chamber 4. The same applies to the lower light emission member 15.

(9) A condensing lens (not shown) that unidirectionally gathers light L emitted from the light emission member 12 may be provided between the light emission member 12 and the peripheral edge portion of the first principal surface of the substrate W. The condensing lens makes it possible to reduce the irradiation region RA. Additionally, a polarizer (not shown) is used, and a width in which light L emitted from the light emission member 12 passes through the polarizer is made small, and, as a result, it is possible to adjust the size of the irradiation region RA.

(10) In each of the aforementioned preferred embodiments, the controller 3 controls the entirety of the substrate processing apparatus 1. However, a controller that controls each member of the substrate processing apparatus 1 may be dispersed on a plurality of places. Additionally, the controller 3 is not required to directly control each member, and a signal output from the controller 3 may be received by a slave controller that controls each member of the substrate processing apparatus 1.

(11) Unlike each of the aforementioned preferred embodiments, the substrate W is not necessarily required to be held by the spin chuck 5 in a horizontal posture, and may be held in a vertical posture, or may be held in a posture in which the principal surface of the substrate W is inclined with respect to a horizontal plane.

(12) Additionally, in the aforementioned preferred embodiments, the substrate processing apparatus 1, 1A includes the transfer robots (first transfer robot IR and second transfer robot CR), the plurality of processing units 2, and the controller 3. However, the substrate processing apparatus 1, 1A may be composed of the single processing unit 2 and the controller 3, and is not necessarily required to include the transfer robots. Alternatively, the substrate processing apparatus 1, 1A may consist of only the single processing unit 2. In other words, the processing unit 2 may be an example of the substrate processing apparatus.

(13) Although the terms "along," "horizontal," "vertical," and "cylindrical" are used in the aforementioned preferred embodiments, these terms "along," "horizontal," "vertical," and "cylindrical" are not required to be strictly defined. In other words, each of these terms permits differences in manufacturing accuracy, installing accuracy, etc.

(14) Additionally, although there are cases in which each configuration is schematically shown with blocks, the shape, the size, and the positional relationship of each block do not show the shape, the size, and the positional relationship of each configuration.

While the preferred embodiments of the present invention have been described in detail, these are merely specific examples used to clarify the technical content of the present invention and the present invention should not be interpreted as being limited to these specific examples, and the scope of the present invention shall be limited only by the appended claims.

REFERENCE SIGNS LIST

1: Substrate processing apparatus
1A: Substrate processing apparatus
4: Chamber
4*a*: Upper wall (Supporting wall)
9: Polymer-containing liquid nozzle (Polymer film forming member)
12: Light emission member
13: Reflection suppression member
14: Direction changing member
18: Spin base (Substrate holding member)
20: Rotation driving mechanism (Substrate rotation mechanism)
70: First portion
70*a*: Facing surface
70*b*: Orthogonal surface
70*c*: Inclined surface
71: Second portion
90: Recess portion
91: Support portion
92: Reflecting portion
100: Polymer film
A1: Rotational axis
A2: Center axis
CP: Center portion
IA: Inner region
L: Light
PA: Peripheral region
RA: Irradiation region
RA1: First irradiation region
RA2: Second irradiation region
RD: Rotation direction W: Substrate
W1: First principal surface
W2: Second principal surface

The invention claimed is:

1. A substrate processing apparatus that processes a substrate having a first principal surface and a second principal surface on a side opposite to the first principal surface, the substrate processing apparatus comprising:
a substrate holder that holds the substrate in a predetermined processing posture;
a polymer film forming member, including a polymer-containing liquid nozzle, that forms a polymer film that contains a photoacid generator that generates an acid by light irradiation and that contains a polymer on the first principal surface of the substrate held by the substrate holder;
a light emitter that emits light and that irradiates light onto a peripheral edge portion of the first principal surface of the substrate held by the substrate holder;
a removing liquid supply member, including a removing liquid nozzle, that supplies a removing liquid onto the first principal surface of the substrate held by the substrate holder to remove the polymer film from the first principal surface of the substrate; and
a reflection suppressor including a first portion that is placeable at an adjoining position that adjoins an irradiation region, onto which light from the light emitter is irradiated, of the peripheral edge portion of the first principal surface of the substrate held by the substrate holder from a center portion side of the first principal surface of the substrate, the reflection suppressor suppressing optical reflection from the reflection suppressor; wherein
the light from the light emitter, irradiated onto the irradiation region, causes the photoacid generator to generate the acid within the polymer film in the irradiation region, and the peripheral edge portion of the first principal surface of the substrate is etched by the acid.

2. The substrate processing apparatus according to claim 1, further comprising
a substrate rotation driver that rotates the substrate around a rotational axis passing through a center portion of the first principal surface of the substrate held by the substrate holder,
wherein the light emitter emits light toward a predetermined range in a rotation direction around the rotational axis in the peripheral edge portion of the first principal surface of the substrate held by the substrate holder.

3. The substrate processing apparatus according to claim 2, wherein the reflection suppressor further includes a second portion that is connected to the first portion and that adjoins the irradiation region from at least one side of the rotation direction when the first portion is placed at the adjoining position.

4. The substrate processing apparatus according to claim 2, wherein the first portion assumes an annular shape or a circular shape having a center axis, and the center axis is placed on the rotational axis when the first portion is placed at the adjoining position.

5. The substrate processing apparatus according to claim 1, wherein the adjoining position is an intercept position at which the first portion intercepts part of light emitted from the light emitter.

6. The substrate processing apparatus according to claim 1, wherein the first portion includes:
a facing surface that faces the first principal surface of the substrate in a state parallel to the first principal surface of the substrate held by the substrate holder when the first portion is placed at the adjoining position; and
an orthogonal surface that is connected to the facing surface and that is orthogonal to the facing surface.

7. The substrate processing apparatus according to claim 1, wherein the first portion includes:
a facing surface that faces the first principal surface of the substrate in a state parallel to the first principal surface of the substrate held by the substrate holder when the first portion is placed at the adjoining position; and
an inclined surface that is connected to the facing surface so as to make an acute angle with the facing surface inside the first portion and that is inclined with respect to the facing surface.

8. The substrate processing apparatus according to claim 1, further comprising a chamber that houses the substrate holder, the chamber including a supporting wall that faces the first principal surface of the substrate held by the substrate holder and that supports the light emitter.

9. The substrate processing apparatus according to claim 1, further comprising a direction changer that changes a traveling direction of light emitted from the light emitter so that the traveling direction of the light approaches an orthogonal direction with respect to the first principal surface of the substrate held by the substrate holder.

10. The substrate processing apparatus according to claim 9, wherein the direction changer includes:
a support portion having a recess portion that is capable of housing the peripheral edge portion of the substrate held by the substrate holder; and
a reflecting portion that is provided at an edge portion of the recess portion and that reflects light emitted from the light emitter, the reflecting portion facing both the first principal surface and the second principal surface of the substrate in a state in which the peripheral edge portion of the substrate held by the substrate holder is housed in the recess portion.

11. A substrate processing method for processing a substrate having a first principal surface and a second principal surface on a side opposite to the first principal surface, the substrate processing method comprising:
a substrate holding step of holding the substrate in a predetermined processing posture;
a polymer film forming step of forming a polymer film that contains a photoacid generator that generates an acid by light irradiation and that contains a polymer on the first principal surface of the substrate; and
a light irradiation step of irradiating light onto a region on the first principal surface of the substrate that adjoins a reflection suppressor from a side opposite to a center portion of the first principal surface of the substrate with respect to the reflection suppressor in a state in which the reflection suppressor that suppresses light reflection faces a peripheral edge portion of the first principal surface of the substrate; wherein
the light irradiated onto the irradiation region causes the photoacid generator to generate the acid within the polymer film in the irradiation region, and the peripheral edge portion of the first principal surface of the substrate is etched by the acid.

12. The substrate processing method according to claim 11, wherein the polymer film forming step includes a step of forming the polymer film in the peripheral region without forming the polymer film in a more inward region on a center portion side than a peripheral region including the peripheral edge portion in the first principal surface of the substrate.

13. The substrate processing method according to claim 11, further comprising a substrate rotating step of rotating the substrate around a rotational axis passing through a center portion of the substrate, wherein the light irradiation step includes a step of irradiating light onto a predetermined range in a rotation direction around the rotational axis in the peripheral edge portion of the first principal surface of the substrate.

14. The substrate processing method according to claim 11, further comprising an irradiation region adjusting step of adjusting a size of an irradiation region onto which light is irradiated in the first principal surface of the substrate by disposing the reflection suppressor at an intercept position at which part of light emitted from the light emitter is intercepted in the light irradiation step.

15. The substrate processing method according to claim 14, wherein the polymer film forming step and the light irradiation step are alternately performed a plurality of times, and the plurality of light irradiation steps include a first light irradiation step of emitting light toward the peripheral edge portion of the first principal surface of the substrate and a second light irradiation step of emitting light toward the peripheral edge portion of the first principal surface of the substrate, the second light irradiation step being performed after the first light irradiation step, and the irradiation region adjusting step includes a step of moving the reflection suppressor so that a first irradiation region in which light is irradiated onto the first principal surface of the substrate in the first light irradiation step reaches a side closer to the center portion of the first principal surface of the substrate than a second irradiation region in which light is irradiated onto the first principal surface of the substrate in the second light irradiation step.

16. The substrate processing apparatus according to claim 1, wherein the removing liquid supply member supplies the removing liquid onto the first principal surface of the substrate after irradiating the light onto the peripheral edge portion of the first principal surface of the substrate.

* * * * *